US008605028B2

(12) United States Patent
Sakamoto et al.

(10) Patent No.: US 8,605,028 B2
(45) Date of Patent: Dec. 10, 2013

(54) SCANNING SIGNAL LINE DRIVE CIRCUIT, SHIFT REGISTER AND DISPLAY DEVICE

(75) Inventors: Mayuko Sakamoto, Osaka (JP); Yasuaki Iwase, Osaka (JP); Yoshiki Nakatani, Osaka (JP); Yoshihisa Takahashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 297 days.

(21) Appl. No.: 12/998,340

(22) PCT Filed: Jun. 16, 2009

(86) PCT No.: PCT/JP2009/060956
§ 371 (c)(1),
(2), (4) Date: Apr. 8, 2011

(87) PCT Pub. No.: WO2010/061657
PCT Pub. Date: Jun. 3, 2010

(65) Prior Publication Data
US 2011/0193853 A1    Aug. 11, 2011

(30) Foreign Application Priority Data

Nov. 28, 2008   (JP) ................................. 2008-303550

(51) Int. Cl.
    *G09G 3/36*    (2006.01)
(52) U.S. Cl.
    USPC ................. 345/100; 377/64; 377/68; 377/78; 377/79
(58) Field of Classification Search
    USPC ....................... 345/100; 377/64–81
    See application file for complete search history.

(56) References Cited

U.S. PATENT DOCUMENTS

| 5,410,583 | A | * | 4/1995 | Weisbrod et al. | 377/75 |
| 5,517,542 | A | * | 5/1996 | Huq | 377/78 |
| 5,701,136 | A | * | 12/1997 | Huq et al. | 345/100 |
| 6,504,522 | B2 | * | 1/2003 | Shiraki et al. | 345/98 |
| 6,621,886 | B2 | * | 9/2003 | Kawahata | 377/1 |
| 6,891,916 | B2 | * | 5/2005 | Park et al. | 377/68 |
| 7,486,269 | B2 | * | 2/2009 | Moon | 345/100 |
| 2005/0008114 | A1 | | 1/2005 | Moon | |

(Continued)

FOREIGN PATENT DOCUMENTS

| JP | 2005-050502 A | 2/2005 |
| JP | 2005-522734 A | 7/2005 |
| JP | 2006-190437 A | 7/2006 |
| JP | 2006-351165 A | 12/2006 |
| JP | 2006-351171 A | 12/2006 |
| JP | 2007-095190 A | 4/2007 |
| JP | 2007-151092 A | 6/2007 |

*Primary Examiner* — Alexander Eisen
*Assistant Examiner* — Sanjiv D Patel
(74) *Attorney, Agent, or Firm* — Harness, Dickey & Pierce, P.L.C.

(57) ABSTRACT

There is provided a display device capable of preventing a malfunction and a display defect due to an off-leak from occurring even when a circuit in a shift register is configured utilizing thin film transistors of relatively large off-leaks. In at least one embodiment, each of bistable circuits that constitute the shift register includes: a thin film transistor for increasing a potential of an output terminal based on a first clock; a thin film transistor for decreasing the potential of the output terminal; a thin film transistor for increasing a potential of a range netA connected to a gate terminal of the thin film transistor based on a start signal; thin film transistors for decreasing the potential of the range netA; a capacitor for increasing the potential of a range netB connected to a gate terminal of the thin film transistor; and a thin film transistor for decreasing the potential of the range netB.

14 Claims, 28 Drawing Sheets

(56) References Cited

U.S. PATENT DOCUMENTS

| | | |
|---|---|---|
| 2006/0262074 A1 | 11/2006 | Shimoda |
| 2006/0279511 A1 | 12/2006 | Uh et al. |
| 2007/0070020 A1 | 3/2007 | Edo et al. |
| 2008/0095297 A1* | 4/2008 | Jang .............................. 377/81 |
| 2008/0101529 A1* | 5/2008 | Tobita ............................ 377/64 |
| 2008/0187089 A1* | 8/2008 | Miyayama et al. ............ 377/79 |
| 2008/0219401 A1* | 9/2008 | Tobita ............................ 377/79 |
| 2008/0284698 A1 | 11/2008 | Lee et al. |
| 2010/0026619 A1 | 2/2010 | Umezaki |

* cited by examiner

Fig.8

|      | t0~t1 | t1~t2 | t2~t3 | t3~t4 | t4~t5 | t5~t6 |
|------|-------|-------|-------|-------|-------|-------|
| netA | MB    |       | ML    |       | ME1   | ML    |
| netB | MJ    | MJ    |       |       | Cap2  |       |
| OUT  |       |       | MN    |       |       | MN    |

Fig.13

|      | t0~t1 | t1~t2 | t2~t3 | t3~t4 | t4~t5 | t5~t6 |
|------|-------|-------|-------|-------|-------|-------|
| netA | MB    |       | ML    |       | ME1   | ML    |
| netB | MJ    | MJ    | MK1   |       | Cap2  | MK1   |
| OUT  |       |       | MN    |       |       | MN    |

|      | t0~t1 | t1~t2 | t2~t3 | t3~t4 | t4~t5 | t5~t6 |
|------|-------|-------|-------|-------|-------|-------|
| netA | MB    |       | ML    |       | ME1   |       |
| netB | MJ    | MJ    |       |       | Cap2  |       |
| OUT  |       |       | MN    |       | MM    |       |

Fig.19

|      | t0~t1 | t1~t2 | t2~t3 | t3~t4 | t4~t5 | t5~t6 |
|------|-------|-------|-------|-------|-------|-------|
| netA | MB    |       | ML    |       | ME1   |       |
| netB | MJ    | MJ    |       |       | Cap2  |       |
| OUT  | MD1   |       | MN    | MD1   |       |       |

|      | t0~t1 | t1~t2 | t2~t3  | t3~t4 | t4~t5 | t5~t6 |
|------|-------|-------|--------|-------|-------|-------|
| netA | MB    |       | ML     |       | ME1   |       |
| netB | MJ    | MJ    | MK1    |       | Cap2  | MK1   |
| OUT  |       |       | MN/MD1 |       | MM    | MD1   |

82

US 8,605,028 B2

SCANNING SIGNAL LINE DRIVE CIRCUIT, SHIFT REGISTER AND DISPLAY DEVICE

TECHNICAL FIELD

The present invention relates to a display device and a drive circuit thereof, and, in particular, to a shift register within a scanning signal line drive circuit that drives scanning signal lines provided within a display unit of the display device.

BACKGROUND ART

Liquid crystal display devices utilizing amorphous silicon thin film transistors (hereinafter referred to as "a-Si TFTs") as driver elements have conventionally been known. In recent years, development of liquid crystal display devices utilizing microcrystalline silicon thin film transistors (hereinafter referred to as "μc-Si TFTs") as driver elements is moving forward. Mobility of microcrystalline silicon is greater than that of amorphous silicon, and the μc-Si TFTs can be formed by a process similar to that of the a-Si TFTs. For this reason, employment of the μc-Si TFTs as the driver elements is expected to realize such as a cost reduction by decreasing a frame area, a cost reduction by decreasing a number of chips in a driver IC, an improvement of a mounting yield, and an increase in size of display devices. Further, the μc-Si TFTs have a characteristic that a threshold shift (a change in a threshold voltage) when a voltage is applied to a gate electrode for an extended period of time is smaller than that of the a-Si TFTs. In other words, the μc-Si TFTs are more reliable than the a-Si TFTs in that the μc-Si TFTs are insusceptible to degradation.

By the way, a display unit of an active matrix-type liquid crystal display device includes a plurality of source bus lines (video signal lines), a plurality of gate bus lines (scanning signal lines), and a plurality of pixel formation portions respectively provided at intersections of the plurality of source bus lines and the plurality of gate bus lines. These pixel formation portions are arranged in a matrix to constitute a pixel array. Each pixel formation portion includes such as a thin film transistor as a switching element whose gate terminal is connected to the gate bus line that passes the corresponding intersection and whose source terminal is connected to the source bus line that passes the corresponding intersection, and a pixel capacitance for storing a pixel value. Further, such an active matrix-type liquid crystal display device is provided with a source driver (video signal line drive circuit) for driving the plurality of source bus lines and a gate driver (scanning signal line drive circuit) for driving the plurality of gate bus lines.

Video signals indicating pixel values are transferred via the source bus lines. However, it is not possible to transfer video signals indicating pixel values for the plurality of lines at one time (the same time) through a single source bus line. For this reason, the video signals are written to the pixel capacitances in the pixel formation portions arranged in a matrix sequentially line by line. Therefore, the gate driver is configured by a shift register having a plurality of stages so that the plurality of gate bus lines are sequentially selected for a predetermined period.

FIG. 28 is a circuit diagram illustrating a configurational example of a single stage of a shift register included in the conventional gate driver. The circuit includes thin film transistors MA, MB, MD, ME, ML, MN, and MI, and a capacitor Cap1. A source terminal of the thin film transistor MB, a drain terminal of the thin film transistor MA, a drain terminal of the thin film transistor ME, a drain terminal of the thin film transistor ML, a gate terminal of the thin film transistor MI, and one end of the capacitor Cap1 are connected to each other via a range (wiring) netA. An output terminal 96 connected to the gate bus line is connected to a drain terminal of the thin film transistor MI. In the above configuration, the netA is precharged by supplying a pulse of a start signal S to an input terminal 92. When a potential of a clock CKA changes from a low level to a high level in this state, as a parasitic capacitance (not shown) occurs between the gate and source of the thin film transistor MI, a potential of the netA increases via the parasitic capacitance. This turns the thin film transistor MI to an ON state, increases a potential of the output terminal 96, and turns the gate bus line connected to this output terminal 96 to a selected state. Such an operation is sequentially carried out in each of the stages that configure the shift register, and whereby the plurality of gate bus lines are sequentially turned to the selected state and the video signals are written to the pixel capacitances line by line.

Further, Japanese Unexamined Patent Application Publication No. 2006-351171 discloses a circuit diagram as a configuration of a single stage of a shift register as shown in FIG. 29. According to this configuration, an effect of a parasitic capacitance can be minimized and a stable gate output can be generated. Moreover, Japanese Unexamined Patent Application Publication No. 2006-190437 discloses an invention relating to a shift register capable of preventing a malfunction due to degradation of a thin film transistor from occurring.

PRIOR ART DOCUMENTS

Patent Documents

[Patent Document 1] Japanese Unexamined Patent Application Publication No. 2005-50502
[Patent Document 2] Japanese Unexamined Patent Application Publication No. 2006-351171
[Patent Document 3] Japanese Unexamined Patent Application Publication No. 2006-190437

SUMMARY OF THE INVENTION

Problems to be Solved by the Invention

However, according to the configuration shown in FIG. 28, a malfunction of the shift register or a display defect can be caused due to a leak current in the thin film transistor MI. This is described in the following.

As described above, there is a parasitic capacitance occurring between the gate and source of the thin film transistor MI. For this reason, when the potential of the clock CKA changes from the low level to the high level, the potential of the netA increases through the parasitic capacitance. In the meantime, as it is sufficient that each gate bus line is turned to the selected state only once in a single frame period (single horizontal scanning period) (the gate bus line should be maintained in an unselected state in the rest of the period), the potentials of the netA and the output terminal 96 should be maintained at the low level in most of the periods. However, the clock CKA described above changes from the low level to the high level every two horizontal scanning periods. For this reason, the potential of the netA increases even in the period during which the gate bus lines should be maintained in the unselected state, and the leak current flows through the thin film transistor MI. At this time, as the thin film transistor MI, a node 97 (the same potential as the output terminal 96), the thin film transistor ME, and the netA constitute a loop as shown in FIG. 28, the potentials of the netA and the output terminal 96 increase so as to become closer to the potential at the high level due to the leak current. For this reason, the potential of the output terminal 96 increases in the period during which the potential of the output terminal 96 should be maintained at the low level. In this manner, the shift register operates abnormally, resulting in a display defect.

Further, according to the circuit configuration shown in FIG. 29, as clock signals of two phases are used, a thin film transistor in which such a clock signal is supplied to its gate electrode is susceptible to degradation. For this reason, prevention of a malfunction of the shift register due to degradation of thin film transistors becomes a problem.

Moreover, the μc-Si TFT described above has a larger off-leak (a leak current that occurs in the OFF state) than the a-Si TFT, and therefore in a case in which the μc-Si TFT is utilized in the conventional circuit configuration, a malfunction and a display defect due to a leak current can occur more easily as compared to the case in which the a-Si TFT is utilized.

Accordingly, an object of the present invention is to provide a display device capable of preventing a malfunction and a display defect due to the off-leak from occurring even when a circuit in a shift register is configured utilizing thin film transistors of relatively large off-leaks.

Means for Solving the Problems

A first aspect of the present invention is directed to a scanning signal line drive circuit of a display device that drives a plurality of scanning signal lines that are provided for a display unit, the scanning signal line drive circuit comprising:

a shift register that includes a plurality of bistable circuits that are connected in series to each other, each having a first state and a second state, the bistable circuits being sequentially turned to the first state based on clock signals of three phases including first, second, and third clock signals that are externally inputted and whose potentials are cyclically turned between a high level and a low level, wherein each bistable circuit includes:
an output-node charge unit having a first switching element whose third electrode is connected to an output-node for outputting a state signal which should indicate one of the first state and the second state and whose second electrode is supplied with the first clock signal, and configured to turn a state indicated by the state signal to the first state;
a first output-node discharge unit to receive at least one of the second clock signal and the third clock signal, and turn the state indicated by the state signal to the second state;
a first-node charge unit to charge a first-node connected to a first electrode of the first switching element based on one of a predetermined input signal and a state signal outputted from a bistable circuit of a previous stage of a current bistable circuit;
a first first-node discharge unit to receive at least one of the second clock signal and the third clock signal, and discharge the first-node;
a second first-node discharge unit to discharge the first-node, the second first-node discharge unit having a second switching element whose third electrode is connected to the first-node;
a second-node charge unit to charge a second-node connected to a first electrode of the second switching element based on the first clock signal; and a first second-node discharge unit to discharge the second-node, the first second-node discharge unit having a third switching element whose first electrode is connected to the first-node and whose third electrode is connected to the second-node, and a duty ratio indicating a ratio of a period, in which a high level potential is maintained, to a cycle, in which the clock signals of the three phases repeat a high level potential and a low level potential, is one third, and the phases of the first, second, and third clock signals are different from each other by one third of one cycle.

According to a second aspect of the present invention, in the first aspect of the present invention,
in each bistable circuit,
the first output-node discharge unit includes a fourth switching element whose third electrode is connected to the output-node, and whose first electrode is supplied with one of the second clock signal, the third clock signal, and a state signal outputted from a bistable circuit of a subsequent stage of the current bistable circuit,
the first-node charge unit includes a fifth switching element whose second electrode is connected to the first-node, and whose first electrode and third electrode are supplied with one of the predetermined input signal and the state signal outputted from the bistable circuit of the previous stage of the current bistable circuit, and
the first first-node discharge unit includes a sixth switching element whose third electrode is connected to the first-node, and whose first electrode is supplied with one of the second clock signal, the third clock signal, and the state signal outputted from the bistable circuit of the subsequent stage of the current bistable circuit.

According to a third aspect of the present invention, in the second aspect of the present invention,
each bistable circuit further includes a second output-node discharge unit to discharge the output-node, the second output-node discharge unit having a seventh switching element whose first electrode is connected to the second-node, and whose third electrode is connected to the output-node, and
in each bistable circuit, the first electrode of the fourth switching element and the first electrode of the sixth switching element are supplied with the state signal outputted from the bistable circuit of the subsequent stage of the current bistable circuit.

According to a fourth aspect of the present invention, in the third aspect of the present invention,
second electrodes of the second switching element, the third switching element, the fourth switching element, the sixth switching element, and the seventh switching element are supplied with one of the second clock signal, the third clock signal, and a direct-current potential that is equal to a potential of the clock signals of the three phases at the low level.

According to a fifth aspect of the present invention, in the third aspect of the present invention,
each bistable circuit further includes a second second-node discharge unit to discharge the second-node, the second second-node discharge unit having a ninth switching element whose first electrode is supplied with one of the second clock signal and the third clock signal, whose second electrode is supplied with one of the second clock signal, the third clock signal, and a direct-current potential that is equal to a potential of the clock signals of the three phases at the low level, and whose third electrode is connected to the second-node.

According to a sixth aspect of the present invention, in the third aspect of the present invention,
each bistable circuit further includes:
a fourth output-node discharge unit to discharge the output-node, the fourth output-node discharge unit having a tenth switching element whose first electrode is supplied with one of the second clock signal and the third clock signal, whose second electrode is supplied with one of the second clock signal, the third clock signal, and a direct-current potential that is equal to a potential of the clock signals of the three phases at the low level, and whose third electrode is connected to the output-node;
a third first-node discharge unit to discharge the first-node, the third first-node discharge unit having an eleventh switching element whose first electrode is supplied with one of the second clock signal and the third clock signal, whose second electrode is supplied with one of the second clock signal, the third clock signal, and the direct-current potential that is equal to the potential of the clock signals of the three phases at the low level, and whose third electrode is connected to the first-node; and
a third second-node discharge unit to discharge the output-node, the third second-node discharge unit having a twelfth switching element whose first electrode is supplied with one of the second clock signal and the third clock signal, whose second electrode is supplied with one of the second clock signal, the third clock signal, and the direct-current potential that is equal to the potential of the clock signals of the three phases at the low level, and whose third electrode is connected to the second-node.

According to a seventh aspect of the present invention, in the second aspect of the present invention,
each bistable circuit further includes a third output-node discharge unit to discharge the output-node, the third output-node discharge unit having an eighth switching element whose first electrode is supplied with one of the second clock signal and the third clock signal, and whose third electrode is connected to the output-node, and
in each bistable circuit, the first electrode of the fourth switching element and the first electrode of the sixth switching element are supplied with the state signal outputted from the bistable circuit of the subsequent stage of the current bistable circuit.

According to an eighth aspect of the present invention, in the seventh aspect of the present invention,
second electrodes of the second switching element, the third switching element, the fourth switching element, the sixth switching element, and the eighth switching element are supplied with one of the second clock signal, the third clock signal, and a direct-current potential that is equal to a potential of the clock signals of the three phases at the low level.

According to a ninth aspect of the present invention, in the first aspect of the present invention,
each bistable circuit further includes a second second-node discharge unit to discharge the second-node, the second second-node discharge unit having a ninth switching element whose first electrode is supplied with one of the second clock signal and the third clock signal, and whose third electrode is connected to the second-node.

According to a tenth aspect of the present invention, in the ninth aspect of the present invention,
second electrodes of the second switching element, the third switching element, the fourth switching element, the sixth switching element, and the ninth switching element are supplied with one of the second clock signal, the third clock signal, and a direct-current potential that is equal to a potential of the clock signals of the three phases at the low level.

According to an eleventh aspect of the present invention, in the first aspect of the present invention,
each bistable circuit further includes a capacitor whose one end is connected to the first-node, and the other end is connected to the output-node.

According to a twelfth aspect of the present invention, in the first aspect of the present invention,
the second-node charge unit includes a capacitor whose one end is connected to the second-node, and the other end is supplied with the first clock signal.

According to a thirteenth aspect of the present invention, in the first aspect of the present invention,
the second-node charge unit includes a thirteenth switching element whose third electrode is connected to the second-node, and whose first electrode and second electrode are supplied with the first clock signal.

According to a fourteenth aspect of the present invention, in the first aspect of the present invention,
the switching elements included in each bistable circuit are thin film transistors made of microcrystalline silicon.

According to a fifteenth aspect of the present invention, in the first aspect of the present invention,
the switching elements included in each bistable circuit are thin film transistors made of amorphous silicon.

According to a sixteenth aspect of the present invention, in the first aspect of the present invention,
at least one of the switching elements whose third electrode is connected to the first-node is a thin film transistor having a multichannel structure.

A seventeenth aspect of the present invention is directed to a display device comprising:
a display unit; and
a scanning signal line drive circuit configured to drive a plurality of scanning signal lines that are provided for the display unit, wherein
the scanning signal line drive circuit is provided with:
a shift register that includes a plurality of bistable circuits that are connected in series to each other, each having a first state and a second state, the bistable circuits being sequentially turned to the first state based on clock signals of three phases including first, second, and third clock signals that are externally inputted and whose potentials are cyclically turned between a high level and a low level,
each bistable circuit includes:
an output-node charge unit having a first switching element whose third electrode is connected to an output-node for outputting a state signal which should indicate one of the first state and the second state and whose second electrode is supplied with the first clock signal, and configured to turn a state indicated by the state signal to the first state;
a first output-node discharge unit to receive at least one of the second clock signal and the third clock signal, and turn the state indicated by the state signal to the second state;
a first-node charge unit to charge a first-node connected to a first electrode of the first switching element based on one of a predetermined input signal and a state signal outputted from a bistable circuit of a previous stage of a current bistable circuit;
a first first-node discharge unit to receive at least one of the second clock signal and the third clock signal, and discharge the first-node;

a second first-node discharge unit to discharge the first-node, the second first-node discharge unit having a second switching element whose third electrode is connected to the first-node;

a second-node charge unit to charge a second-node connected to a first electrode of the second switching element based on the first clock signal; and a first second-node discharge unit to discharge the second-node, the first second-node discharge unit having a third switching element whose first electrode is connected to the first-node and whose third electrode is connected to the second-node, and a duty ratio indicating a ratio of a period, in which a high level potential is maintained, to a cycle, in which the clock signals of the three phases repeat a high level potential and a low level potential, is one third, and the phases of the first, second, and third clock signals are different from each other by one third of one cycle.

According to an eighteenth aspect of the present invention, in the seventeenth aspect of the present invention, the display device is a driver-monolithic type in which the display unit and the scanning signal line drive circuit are provided over an identical substrate.

A nineteenth aspect of the present invention is directed to a shift register comprising:

a plurality of bistable circuits that are connected in series to each other, each having a first state and a second state, the bistable circuits being sequentially turned to the first state based on clock signals of three phases including first, second, and third clock signals that are externally inputted and whose potentials are cyclically turned between a high level and a low level, wherein each bistable circuit includes:

an output-node charge unit having a first switching element whose third electrode is connected to an output-node for outputting a state signal which should indicate one of the first state and the second state and whose second electrode is supplied with the first clock signal, and configured to turn a state indicated by the state signal to the first state;

a first output-node discharge unit to receive at least one of the second clock signal and the third clock signal, and turn the state indicated by the state signal to the second state;

a first-node charge unit to charge a first-node connected to a first electrode of the first switching element based on one of a predetermined input signal and a state signal outputted from a bistable circuit of a previous stage of a current bistable circuit;

a first first-node discharge unit to receive at least one of the second clock signal and the third clock signal, and discharge the first-node;

a second first-node discharge unit to discharge the first-node, the second first-node discharge unit having a second switching element whose third electrode is connected to the first-node;

a second-node charge unit to charge a second-node connected to a first electrode of the second switching element based on the first clock signal; and a first second-node discharge unit to discharge the second-node, the first second-node discharge unit having a third switching element whose first electrode is connected to the first-node and whose third electrode is connected to the second-node, and a duty ratio indicating a ratio of a period, in which a high level potential is maintained, to a cycle, in which the clock signals of the three phases repeat a high level potential and a low level potential, is one third, and the phases of the first, second, and third clock signals are different from each other by one third of one cycle.

Effects of the Invention

According to the first aspect of the present invention, in each of the bistable circuits that constitute the shift register within the scanning signal line drive circuit of the display device, regarding the first switching element, the first electrode thereof is connected to the first-node, the second electrode thereof is supplied with the first clock signal, and the third electrode thereof is connected to the output-node. For this reason, when the first clock signal changes from the low level to the high level after a potential of the first-node increases based on the predetermined input signal or the state signal of the previous stage, the potential of the first-node further increases due to a parasitic capacitance between the first electrode and the second electrode of the first switching element, thereby turning the first switching element to the ON state. Therefore, a potential of the output-node increases, and the state signal indicating the first state is outputted from the output-node. The output-node is discharged by the first output-node discharge unit. The potential of the first-node increases based on the first clock signal. Further, each bistable circuit is provided with the first first-node discharge unit and the second first-node discharge unit. Moreover, each bistable circuit is provided with the second-node charge unit for charging the second-node connected to the first electrode of the second switching element included in the second first-node discharge unit, and the first second-node discharge unit for discharging the second-node. As the first first-node discharge unit operates based on the second clock signal or the third clock signal, the first-node is discharged by the first first-node discharge unit during a period in which the second clock signal or the third clock signal is at the high level. During a period in which the first clock signal is at the high level, the first-node should be discharged only during a period other than a period in which the state signal indicating the first state should be outputted from the output-node (selected period). In this regard, during the selected period, the potential of the second-node is decreased by the first second-node discharge unit. As this turns the second switching element to the OFF state, the second first-node discharge unit does not decrease the potential of the first-node during the selected period. In this manner, it is possible to cause the shift register within the scanning signal line drive circuit to perform a desired operation.

Regarding the output-node, it is configured to be connected only to the third electrode of the first switching element included in the output-node charge unit and the first output-node discharge unit. Unlike the conventional example, the first-node and the output-node are not connected by the second electrode and the third electrode of the switching element. For this reason, the change in the potential of the output-node does not affect the first-node. Therefore, even when an off-leak occurs in the first switching element, the potential of the first-node does not increase due to an increase of the potential of the output-node, and an off-leak as high as to cause a display defect does not occur. Accordingly, even in a case in which a switching element of relatively large off-leak is employed as a driver element, there is no malfunction of the shift register nor a display defect due to the off-leak of the switching element.

Further, an operation of each of the bistable circuits that constitute the shift register is controlled by the clock signals of the three phases whose duty ratio is one third. For this reason, a frame area (of the display device) does not increase as compared to the configuration of the conventional example in which an operation of each of the bistable circuits is controlled by clock signals of two phases and a power source voltage, and it is possible to suppress degradation of the switching elements in each bistable circuit. This prevents a malfunction of the shift register due to degradation of the switching elements from occurring.

Moreover, as the duty ratio of the clock signal (first clock signal) supplied to the second electrode of the first switching element is one third, the off-leak in the first switching element decreases as compared to a case in which the duty ratio is half. For this reason, a malfunction of the shift register due to the off-leak in the first switching element can be effectively prevented from occurring.

According to the second aspect of the present invention, the same effects as those of the first aspect of the present invention can be obtained with the structure in which the first output-node discharge unit, the first-node charge unit, and the first first-node discharge unit are respectively provided with the switching elements.

According to the third aspect of the present invention, the operation of the fourth and the sixth switching element of each bistable circuit is controlled by supplying a signal that becomes high level only during a single horizontal scanning period of a single frame period to the first electrodes of these switching elements. For this reason, degradation of the switching elements provided for discharging the first-node and the output-node can be suppressed, and a malfunction of the shift register can be effectively prevented from occurring. Further, each bistable circuit is provided with the seventh switching element whose first electrode is connected to the second-node and whose third electrode is connected to the output-node. Here, as the second-node is charged based on the first clock signal, even when an off-leak occurs in the first switching element based on the first clock signal during the period in which the scanning signal line should be maintained in the unselected state, the potential of the output-node can be maintained at the low level by turning the seventh switching element to the ON state. Therefore, an occurrence of a display defect can be suppressed.

According to the fourth aspect of the present invention, by supplying the second clock signal, the third clock signal, or the low direct-current potential to the second electrodes of the second, the third, the fourth, the sixth, and the seventh switching element, the potentials of the first-node, the second-node, and the output-node decrease.

According to the fifth aspect of the present invention, as the second-node is discharged based on the second clock signal or the third clock signal, the potential of the second-node decreases without fail after the potential of the second-node increases based on the first clock signal. For this reason, degradation of the second switching element whose first electrode is connected to the second-node can be suppressed, and a malfunction of the shift register can be prevented from occurring.

According to the sixth aspect of the present invention, by providing the third first-node discharge unit and the third second-node discharge unit, discharging the first-node and the second-node is performed as needed. For this reason, it is possible to effectively suppress degradation of the first switching element whose first electrode is connected to the first-node as well as degradation of the second switching element whose first electrode is connected to the second-node. Further, by providing the fourth output-node discharge unit, the potential of the output-node is fixed to the low level without fail during the period in which the scanning signal line should be in the unselected state, and it is possible to effectively suppress an occurrence of a display defect.

According to the seventh aspect of the present invention, the operation of the fourth and the sixth switching element of each bistable circuit is controlled by supplying a signal that becomes high level only during a single horizontal scanning period of a single frame period to the first electrodes of these switching elements. For this reason, degradation of the switching elements provided for discharging the first-node and the output-node can be suppressed, and a malfunction of the shift register can be effectively prevented from occurring. Further, each bistable circuit is provided with the eighth switching element whose first electrode is supplied with the second or the third clock signal, and whose third electrode is connected to the output-node. For this reason, even when an off-leak occurs in the first switching element based on the first clock signal during the period in which the scanning signal line should be maintained in the unselected state, the potential of the output-node can be maintained at the low level by turning the eighth switching element to the ON state based on the second or the third clock signal. Therefore, an occurrence of a display defect can be suppressed.

According to the eighth aspect of the present invention, by supplying the second clock signal, the third clock signal, or the low direct-current potential to the second electrodes of the second, the third, the fourth, the sixth, and the eighth switching element, the potentials of the first-node, the second-node, and the output-node decrease.

According to the ninth aspect of the present invention, as the second-node is discharged based on the second clock signal or the third clock signal, the potential of the second-node decreases without fail after the potential of the second-node increases based on the first clock signal. For this reason, degradation of the second switching element whose first electrode is connected to the second-node can be suppressed, and a malfunction of the shift register can be prevented from occurring.

According to the tenth aspect of the present invention, by supplying the second clock signal, the third clock signal, or the low direct-current potential to the second electrodes of the second, the third, the fourth, the sixth, and the ninth switching element, the potentials of the first-node, the second-node, and the output-node decrease.

According to the eleventh aspect of the present invention, by providing the capacitor, a decrease of the potential of the first-node during the period in which the scanning signal line should be maintained in the selected state is prevented. For this reason, the voltage level when the scanning signal is at the high level is maintained at a sufficiently high level, and an occurrence of a writing defect of the pixel capacitance in the display unit can be suppressed.

According to the twelfth aspect of the present invention, by providing the capacitor, it is possible to increase the potential of the second-node based on the first clock signal. According to the thirteenth aspect the present invention, by providing the diode-connected switching element, it is possible to increase the potential of the second-node based on the first clock signal.

According to the fourteenth aspect of the present invention, as the thin film transistors made of microcrystalline silicon that is relatively insusceptible to degradation are employed as the switching elements, it is possible to improve reliability of the operation of the shift register.

According to the fifteenth aspect of the present invention, in the configuration in which the thin film transistors made of amorphous silicon are employed as the switching elements, the off-leak in the first switching element is further decreased, and a malfunction of the shift register and a display defect due to the off-leak can be suppressed.

According to the sixteenth aspect of the present invention, as the switching elements for discharging the first-node (the second switching element and the sixth switching element) are configured by the thin film transistors having a multichannel structure, it is possible to prevent the potential of the first-node from decreasing due to a leak current in these switching elements when the potential of the first-node increases.

According to the seventeenth aspect of the present invention, it is possible to realize the display device having the scanning signal line drive circuit providing the same effects as those of the first aspect according to the present invention.

According to the eighteenth aspect of the present invention, it is possible to realize the display device providing the same effects as those of the seventeenth aspect according to the present invention while downsizing the device.

According to the nineteenth aspect of the present invention, it is possible to realize the shift register providing the same effects as those of the first aspect according to the present invention.

BRIEF DESCRIPTION OF THE DRAWINGS

FIG. 8 is a diagram for explaining the operation of the bistable circuit according to the first embodiment.

FIG. 13 is a diagram for explaining an operation of the bistable circuit according to the second embodiment.

FIG. 17 is a diagram for explaining the operation of the bistable circuit according to the third embodiment.

FIG. 19 is a diagram for explaining an operation of the bistable circuit according to the fourth embodiment.

FIG. 21 is a diagram for explaining an operation of the bistable circuit according to the fifth embodiment.

MODE FOR CARRYING OUT THE INVENTION

The following describes embodiments according to the present invention with reference to the accompanying drawings. It should be noted that, in a thin film transistor in the description below, a gate terminal (gate electrode) corresponds to a first electrode, a source terminal (source electrode) corresponds to a second electrode, and a drain terminal (drain electrode) corresponds to a third electrode.

<1. First Embodiment>
<1.1 Overall Configuration and Operation>

Figure 2:
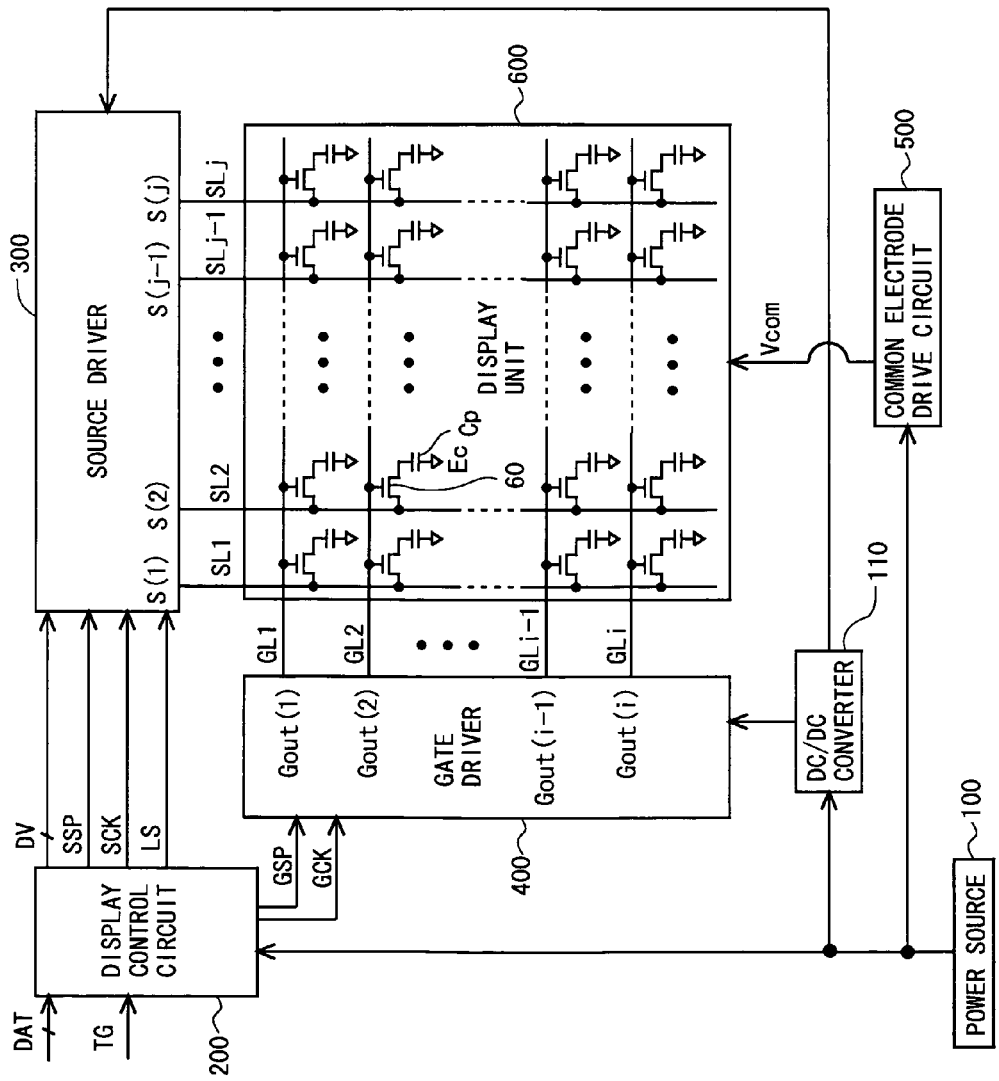
FIG. 2 is a block diagram illustrating an overall configuration of the liquid crystal display device according to the first embodiment.

FIG. 2 is a block diagram illustrating an overall configuration of an active matrix-type liquid crystal display device according to a first embodiment of the present invention. As shown in FIG. 2, the liquid crystal display device is provided with a power source 100, a DC/DC converter 110, a display control circuit 200, a source driver (video signal line drive circuit) 300, a gate driver (scanning signal line drive circuit) 400, a common electrode drive circuit 500, and a display unit 600. Typically, the display unit 600 and the gate driver 400 as a drive circuit are formed on the same substrate, i.e., monolithically.

The display unit 600 includes a plurality of (j) source bus lines (video signal lines) SL1 to SLj, a plurality of (i) gate bus lines (scanning signal line) GL1 to GLi, and a plurality of (i×j) pixel formation portions respectively provided at intersections of the source bus lines SL1 to SLj and the gate bus lines GL1 to GLi. These pixel formation portions are arranged in a matrix to constitute a pixel array. Each pixel formation portion includes a thin film transistor (TFT) 60 which is a switching element whose gate terminal is connected to the gate bus line that passes the corresponding intersection and whose source terminal is connected to the source bus line that passes the corresponding intersection, a pixel electrode connected to a drain terminal of the thin film transistor 60, a common electrode Ec which is an opposed electrode commonly provided for the plurality of pixel formation portions, and a liquid crystal layer commonly provided for the plurality of pixel formation portions and sandwiched between the pixel electrodes and the common electrode Ec. Further, by a liquid crystal capacitance formed by the pixel electrode and the common electrode Ec, a pixel capacitance Cp is configured. Usually, an auxiliary capacitance is provided in parallel to the liquid crystal capacitance to reliably hold voltage in the pixel capacitance. However, the auxiliary capacitance is not directly related to the present invention, so that it is not described and not shown.

The power source 100 supplies a predetermined power source voltage to the DC/DC converter 110, the display control circuit 200, and the common electrode drive circuit 500. The DC/DC converter 110 generates a predetermined direct-current voltage for operating the source driver 300 and the gate driver 400 based on the power source voltage, and supplies the generated voltage to the source driver 300 and the gate driver 400. The common electrode drive circuit 500 supplies a predetermined potential Vcom to the common electrode Ec.

The display control circuit 200 receives an image signal DAT and a timing signal group TG such as a horizontal synchronizing signal, a vertical synchronizing signal, and the like which are sent from an outside, and outputs a digital video signal DV; a source start pulse signal SSP, a source clock signal SCK, a latch strobe signal LS, a gate start pulse signal GSP, and gate clock signal GCK which are used to control image display in the display unit 600.

The source driver 300 receives the digital video signal DV, the source start pulse signal SSP, the source clock signal SCK, and the latch strobe signal LS that have been outputted from the display control circuit 200, and applies driving video signals S(1) to S(j) to the source bus lines SL1 to SLj, respectively.

The gate driver 400 repeats an application of active scanning signals Gout(1) to Gout(i) to the gate bus lines GL1 to GLi, respectively, taking a single vertical scanning period as one cycle, based on the gate start pulse signal GSP and the gate clock signal GCK that have been outputted from the display control circuit 200. The gate driver 400 will be later described in further detail.

As described above, by applying the driving video signals S(1) to S(j) respectively to the source bus lines SL1 to SLj, and by applying the scanning signals Gout(1) to Gout(i) respectively to the gate bus lines GL1 to GLi, an image based on the externally inputted image signal DAT is displayed in the display unit 600.

<1.2 Configuration and Operation of Gate Driver>

Figure 3:
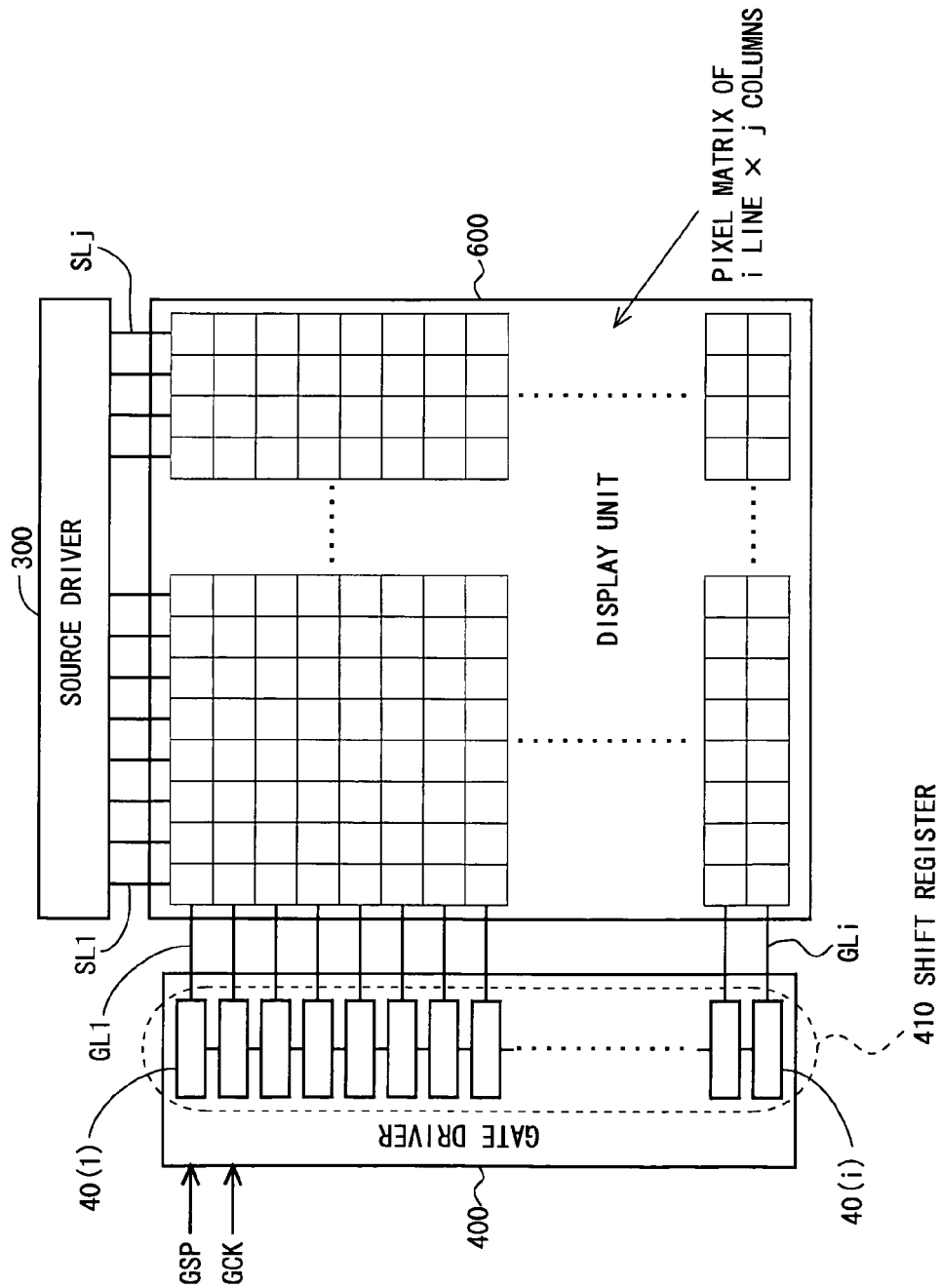
FIG. 3 is a block diagram for explaining a configuration of the gate driver according to the first embodiment.

The following describes an outline of a configuration and an operation of the gate driver 400 according to this embodiment with reference to FIG. 3 through FIG. 6. As shown in FIG. 3, the gate driver 400 is configured by a shift register 410 having a plurality of stages. On the display unit 600, a pixel matrix of i lines×j columns is formed, and the stages of the shift register 410 are provided so as to respectively correspond to the lines of the pixel matrix on a one-to-one basis.

Each stage of the shift register 410 takes one of two states (a first state and a second state) at any time point, and constitutes a bistable circuit configured to output a signal indicating the current state (hereinafter referred to as "state signal"). In this manner, the shift register 410 is configured by i bistable circuits 40(1) to 40(i). According to this embodiment, when a bistable circuit is in the first state, this bistable circuit outputs a state signal at a high level (H level), and when a bistable circuit is in the second state, this bistable circuit outputs a state signal at a low level (L level).

Figure 4:
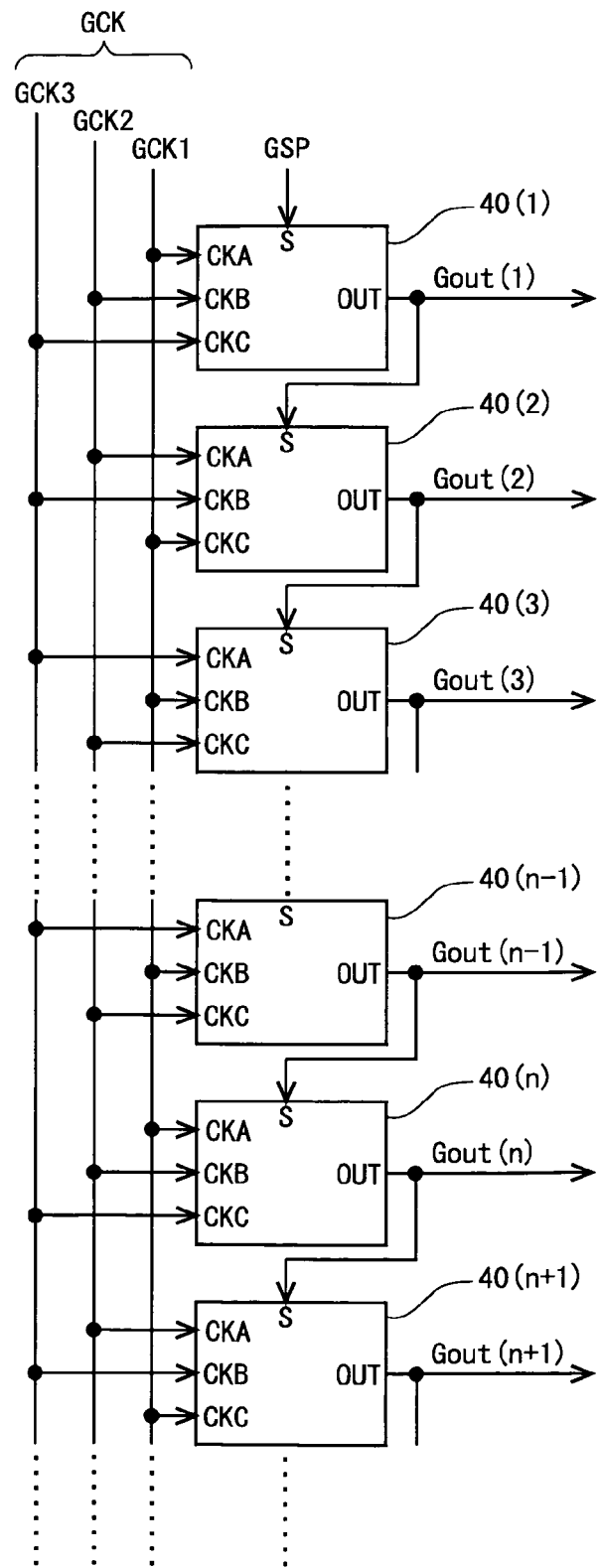
FIG. 4 is a block diagram illustrating a configuration of the shift register within the gate driver according to the first embodiment.

FIG. 4 is a block diagram illustrating a configuration of the shift register 410 within the gate driver 400. As described above, the shift register 410 is configured by the bistable circuits 40(1) to 40(i). Each bistable circuit is provided with input terminals for receiving clock signals CKA, CKB, and CKC of three phases (hereinafter referred to as a "first clock", a "second clock", and a "third clock", respectively), an input terminal for receiving a start signal S, and an output terminal for outputting a state signal OUT.

Figure 5:
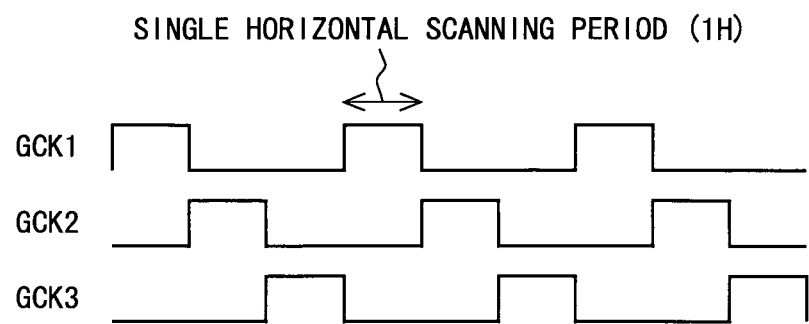
FIG. 5 is a signal waveform chart showing waveforms of first to third gate clock signals according to the first embodiment.

To the shift register 410, clock signals GCK1, GCK2, and GCK3 of the three phases (hereinafter referred to as a "first gate clock signal", a "second gate clock signal", and a "third gate clock signal", respectively) as the gate clock signals GCK, and the gate start pulse signal GSP are supplied from the display control circuit 200. The first to third gate clock signals GCK1 to GCK3 are out of phase with each other by a single horizontal scanning period, as shown in FIG. 5. Further, each of the first to third gate clock signals GCK1 to GCK3 is turned to the state at the high level (H level) only during a single horizontal scanning period within three horizontal scanning periods.

According to this embodiment, the signals supplied to the input terminals of each stage (each bistable circuit) are as described below. Regarding the first stage 40(1), the first gate clock signal GCK1 is supplied as the first clock CKA, the second gate clock signal GCK2 is supplied as the second clock CKB, and the third gate clock signal GCK3 is supplied as the third clock CKC. Regarding the second stage 40(2), the second gate clock signal GCK2 is supplied as the first clock CKA, the third gate clock signal GCK3 is supplied as the second clock CKB, and the first gate clock signal GCK1 is supplied as the third clock CKC. Regarding the third stage 40(3), the third gate clock signal GCK3 is supplied as the first clock CKA, the first gate clock signal GCK1 is supplied as the second clock CKB, and the second gate clock signal GCK2 is supplied as the third clock CKC. Regarding the fourth stage and after, the same configurations from the first stage to the third stage as described above are repeated for every three stage. Further, regarding the first stage 40(1), the gate start pulse signal GSP is supplied as the start signal S. Regarding the second stage 40(2) and after, the state signal OUT of the previous stage is supplied as the start signal S.

Figure 6:
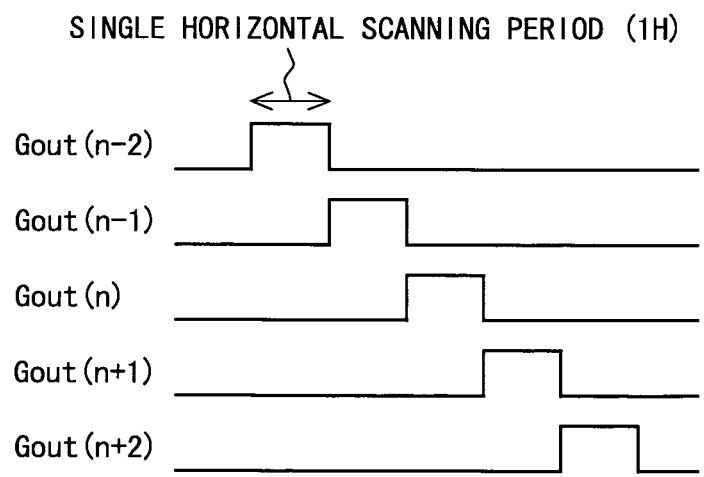
FIG. 6 is a signal waveform chart showing waveforms of scanning signals according to the first embodiment.

When the gate start pulse signal GSP as the start signal S is supplied to the first stage 40(1) of the shift register 410, based on the first to the third gate clock signals GCK1-3, a pulse included in the gate start pulse signal GSP (this pulse is included in the state signal OUT that is outputted in each stage) is transferred from the first stage 40(1) to an i-th stage 40(i) sequentially. According to the transfer of the pulse, the state signals OUT outputted in the respective stages 40(1) to 40(i) are sequentially turned to the high level. The state signals OUT outputted in the respective stages 40(1) to 40(i) are supplied as the scanning signals Gout(1) to Gout(i) to the gate bus lines GL1 to GLi, respectively. In this manner, as shown in FIG. 6, the scanning signals each turned to the high level sequentially for a single horizontal scanning period are supplied to gate bus lines within the display unit 600.

<1.3 Configuration and Operation of Bistable Circuit>

Figure 1:
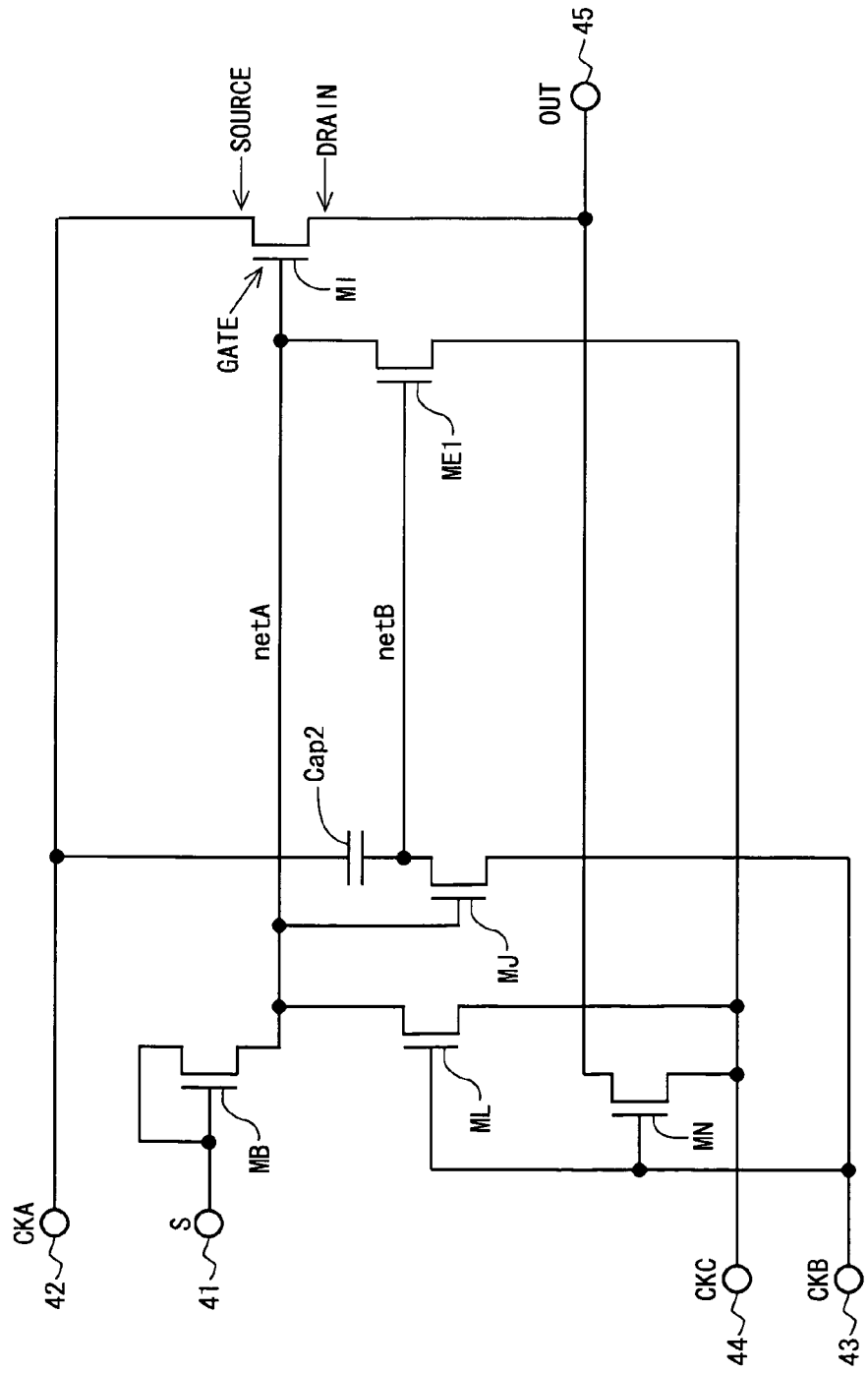
FIG. 1 is a circuit diagram illustrating a configuration of a bistable circuit included in a shift register within a gate driver of a liquid crystal display device according to a first embodiment of the present invention.

FIG. 1 is a circuit diagram illustrating a configuration of the bistable circuit included in the above-described shift register 410 (a configuration of a single stage of the shift register 410). As shown in FIG. 1, the bistable circuit is provided with six thin film transistors MI (first switching element), ME1 (second switching element), MJ (third switching element), MN (fourth switching element), MB (fifth switching element), and ML (sixth switching element), as well as a capacitor Cap2. Further, the bistable circuit includes four input terminals 41 to 44 and a single output terminal (output-node) 45. Note that, the input terminal that receives the start signal S is represented by a reference numeral 41, the input terminal that receives the first clock CKA is represented by a reference numeral 42, the input terminal that receives the second clock CKB is represented by a reference numeral 43, the input terminal that receives the third clock CKC is represented by a reference numeral 44, and the output terminal that outputs the state signal OUT is represented by a reference numeral 45. The following describes a connection relation between the components within the bistable circuit.

A source terminal of the thin film transistor MB, a drain terminal of the thin film transistor ML, a gate terminal of the thin film transistor MJ, a drain terminal of the thin film transistor ME1, and a gate terminal of the thin film transistor MI are connected to each other. Note that, a range (wiring) in which these terminals are connected to each other is referred to as a "netA" (first-node) for convenience sake.

A drain terminal of the thin film transistor MJ, a gate terminal of the thin film transistor ME1, and one end of the capacitor Cap2 are connected to each other. Note that, a range (wiring) in which these terminals are connected to each other is referred to as a "netB" (second-node) for convenience sake.

Regarding the thin film transistor MB, a gate terminal and a drain terminal thereof are connected to the input terminal 41 (i.e., in a diode connection), and a source terminal thereof is connected to the netA. Regarding the thin film transistor ML, a gate terminal thereof is connected to the input terminal 43, a drain terminal thereof is connected to the netA, and a source terminal thereof is connected to the input terminal 44. Regarding the thin film transistor MN, a gate terminal thereof is connected to the input terminal 43, a drain terminal thereof is connected to the output terminal 45, and a source terminal thereof is connected to the input terminal 44. Regarding the thin film transistor MJ, a gate terminal thereof is connected to the netA, a drain terminal thereof is connected to the netB, and a source terminal thereof is connected to the input terminal 43. Regarding the thin film transistor ME1, a gate terminal thereof is connected to the netB, a drain terminal thereof is connected to the netA, and a source terminal thereof is connected to the input terminal 44. Regarding the thin film transistor MI, a gate terminal thereof is connected to the netA, a source terminal thereof is connected to the input terminal 42, and a drain terminal thereof is connected to the output terminal 45. Regarding the capacitor Cap2, the one end thereof is connected to the netB, and the other end thereof is connected to the input terminal 42.

Note that, an output-node charge unit is implemented by the thin film transistor MI, and a first output-node discharge unit is implemented by the thin film transistor MN. Further, a first-node charge unit is implemented by the thin film transistor MB, a first first-node discharge unit is implemented by the thin film transistor ML, and a second first-node discharge unit is implemented by the thin film transistor ME1. Moreover, a second-node charge unit is implemented by the capacitor Cap2, and a first second-node discharge unit is implemented by the thin film transistor MJ.

Next, an operation of the bistable circuit is described with reference to FIG. 1, FIG. 7, and FIG. 8. FIG. 8 shows the components through which an increase in potential (charging) or decrease in potential (discharging) is performed during the respective periods (see FIG. 7), regarding the netA, the netB, and the state signal OUT (output terminal 45). For example, FIG. 8 shows that "in the netA, a change in potential is performed through the thin film transistor ML during a period of t2-t3".

Figure 7:
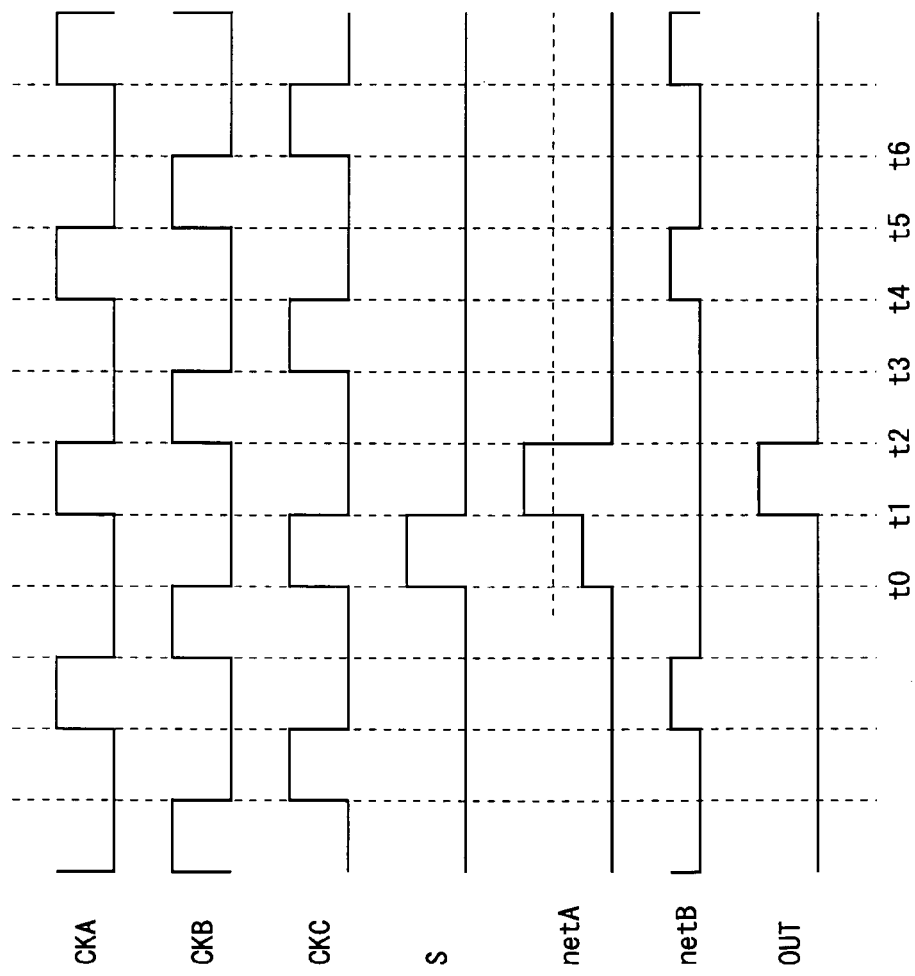
FIG. 7 is a waveform chart for explaining an operation of the bistable circuit according to the first embodiment.

As shown in FIG. 7, during the operation of the liquid crystal display device, the first clock CKA, the second clock CKB, and the third clock CKC are supplied to the input terminals 42 to 44, respectively. At a time point t0, a pulse of the start signal S is supplied to the input terminal 41. As the thin film transistor MB is diode-connected, the netA is precharged by the pulse of the start signal S during a period of t0 to t1. During this period, the thin film transistors ME1 and ML are maintained in an OFF state, as the thin film transistor MJ is maintained in an ON state and the first clock CKA and the second clock CKB are at the low level (L level). For this reason, the potential of the netA that has increased by the precharge does not decrease during this period.

Figure 9:
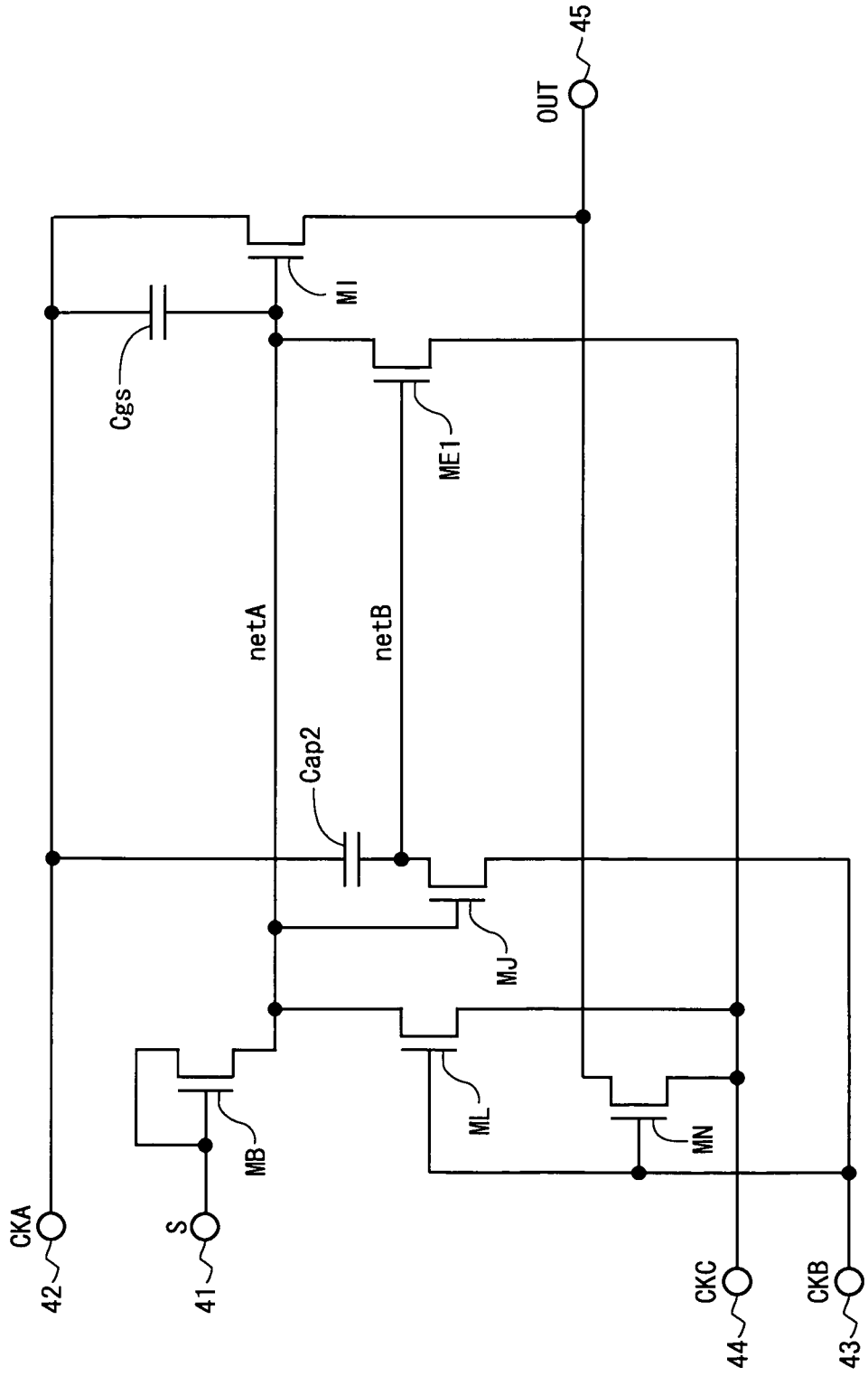
FIG. 9 is a circuit diagram, in which a parasitic capacitance between a gate and a source of a thin film transistor MI is considered, according to the first embodiment.

At a time point t1, the first clock CKA changes from the low level to the high level. Here, the source terminal of the thin film transistor MI is connected to the input terminal 42, and a parasitic capacitance Cgs occurs between the gate and the source of the thin film transistor MI as shown in FIG. 9. For this reason, according to an increase of the source potential of the thin film transistor MI, the potential of the netA also increases (the netA is bootstrapped). As a result, the thin film transistor MI is turned to the ON state. As the state in which the first clock CKA is at the high level is maintained until a time point t2, the state signal OUT is at the high level during a period of t1 to t2. This turns the gate bus line connected to the bistable circuit that outputs the state signal OUT at the high level to the selected state, and a video signal is written to the pixel capacitance Cp in the pixel formation portion of the line corresponding to this gate bus line. During the period of t1 to t2, the thin film transistor NJ is maintained in the ON state, and the second clock CKB is maintained at the low level. For this reason, the potential of the netB is maintained at the low level. Further, during this period, as the second clock CKB is maintained at the low level, the thin film transistors ML and MN are maintained in the OFF state. For this reason, the potentials of the netA and the state signal OUT (output terminal 45) do not decrease during this period.

At the time point t2, the first clock CKA changes from the high level to the low level. In addition, the second clock CKB changes from the low level to the high level. This turns the thin film transistors ML and MN to the ON state. The state in which the second clock CKB is at the high level is maintained until a time point t3. Further, during a period of t2 to t3, the third clock CKC is maintained at the low level. Thus, during the period of t2 to t3, the potential of the netA decreases as the thin film transistor ML is turned to the ON state, and the potential of the state signal OUT (output terminal 45) decreases as the thin film transistor MN is turned to the ON state.

During a period of t3 to t4, as the first clock CKA and the start signal S are maintained at the low level, the potential of the netA does not increase, and the state signal OUT is maintained at the low level.

At a time point t4, the first clock CKA changes from the low level to the high level. Here, as the input terminal 42 and the netB are connected via the capacitor Cap2, the potential of the netB increases as the potential of the input terminal 42 increases. This turns the thin film transistor ME1 to the ON state. Further, during a period of t4 to t5, the third clock CKC is maintained at the low level. For this reason, the potential of the netA is maintained at the low level as the thin film transistor ME1 is in the ON state, regardless of the presence of the parasitic capacitance Cgs as described above. Accordingly, during the period of t4 to t5, the thin film transistor MI is not turned to the ON state, and the state signal OUT is maintained at the low level.

During a period of t5 to t6, as the first clock CKA and the start signal S are maintained at the low level, the state signal OUT is maintained at the low level similarly to the case of the period of t2 to t3. During this period, the thin film transistors ML and MN are in the ON state by the operation similar to that in the period of t2 to t3. For this reason, even when the potential of the state signal OUT or the netA has increased due to such as an off-leak of the thin film transistor MI and the parasitic capacitance Cgs, the increased potential decreases during this period.

During a period after a time point t6, the operations that are carried out during the periods of t3 to t6 are repeated until the pulse of the start signal S is next supplied to the input terminal 41.

<1.4 Effects>

Figure 28:
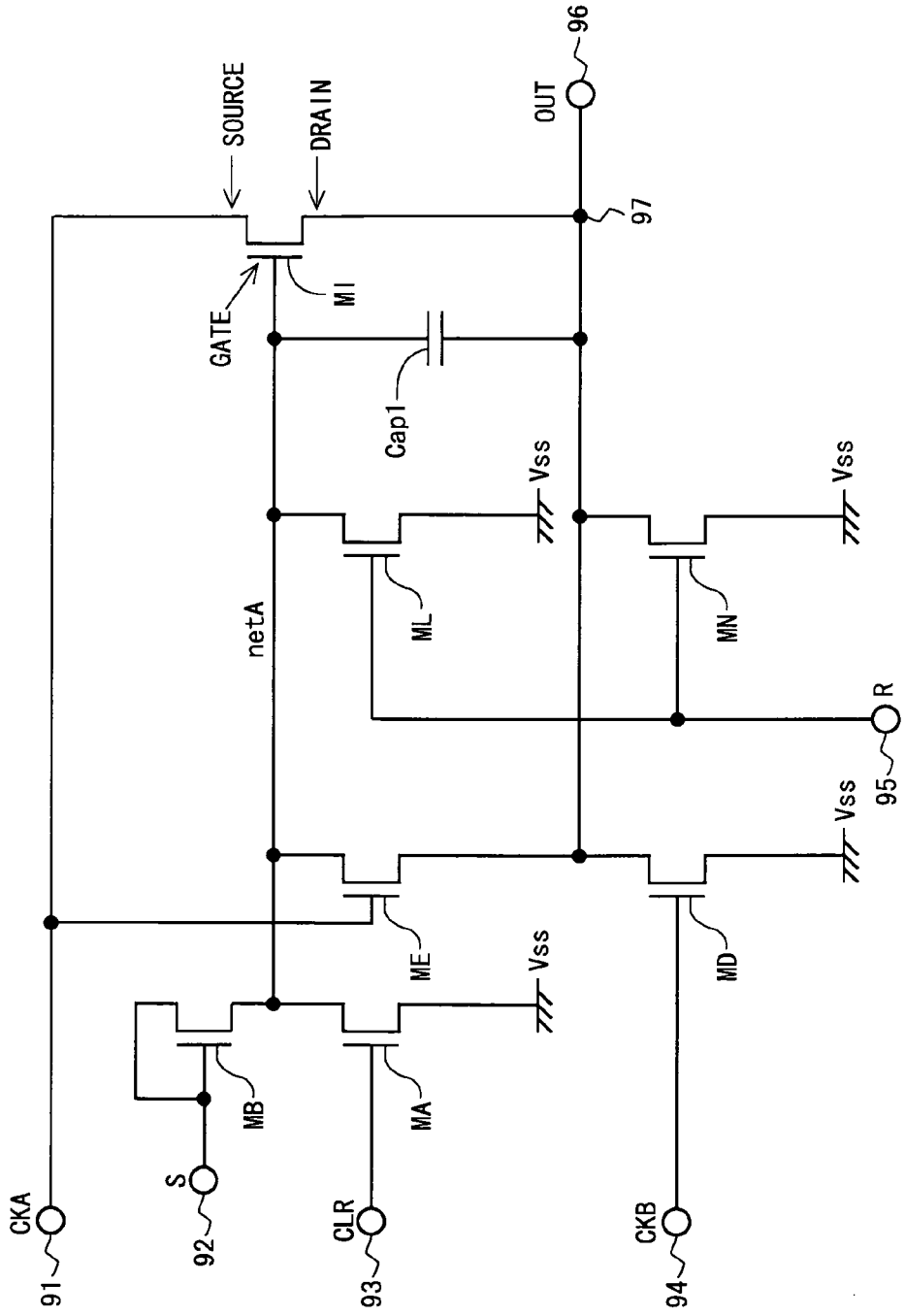
FIG. 28 is a circuit diagram illustrating a configurational example of a single stage of a shift register included in the conventional gate driver.
Figure 29:
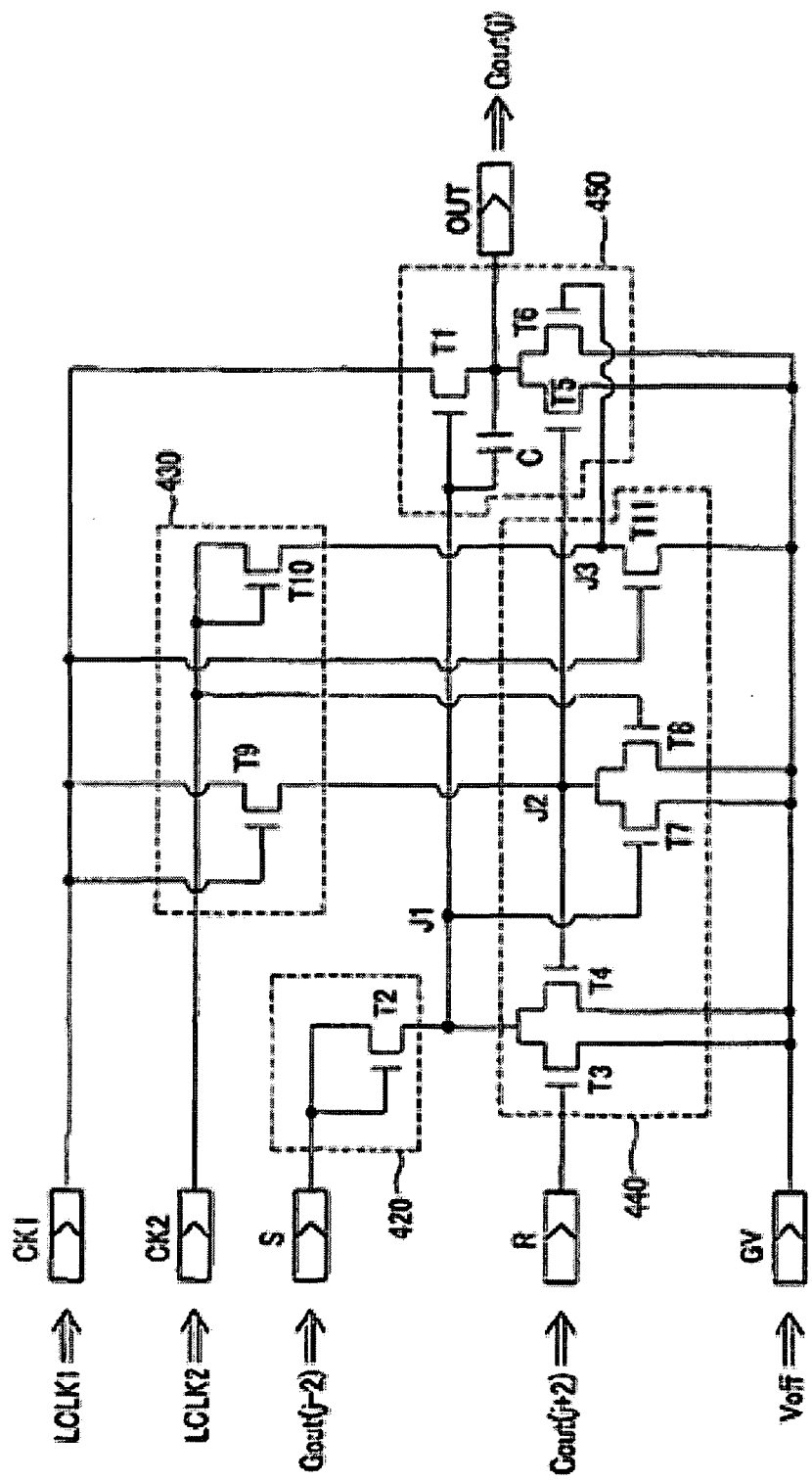
FIG. 29 is a circuit diagram illustrating a configurational example of a single stage of a shift register included in the conventional gate driver.

As described above, according to this embodiment, unlike the configuration of the conventional example shown in FIG. 28, the output terminal 45 is connected only to the drain terminal of the thin film transistor MI and to the drain terminal of the thin film transistor MN. For this reason, the change in the potential of the output terminal 45 does not affect the netA. Therefore, even when an off-leak occurs in the thin film transistor MI, the potential of the netA does not increase due to an increase of the potential of the output terminal 45, and an off-leak as high as to cause a display defect does not occur. Accordingly, even in a case in which a thin film transistor of relatively large off-leak such as a thin film transistor using microcrystalline silicon (μc-Si TFT) is employed as a driver element, there is no malfunction of the shift register 410 nor a display defect due to the off-leak of the thin film transistor.

Further, according to the conventional example, the state signal OUT is controlled based on clock signals of two phases and a power source voltage Vss. However, according to this embodiment, the state signal OUT is controlled based on the clock signals CKA, CKB, and CKC of the three phases. For this reason, a frame area does not increase as compared to the conventional example. Moreover, as a clock signal that is one third of a duty-ratio is supplied to the gate terminal of each thin film transistor, it is possible to suppress degradation of the thin film transistors. As a result, it is possible to prevent a malfunction of the shift register due to degradation of the thin film transistors from occurring without increasing the frame area as compared to the conventional example.

Furthermore, as the duty ratio of the first clock CKA is one third as described above, the off-leak in the thin film transistor MI decreases as compared to a case in which the duty ratio is half. For this reason, a malfunction of the shift register 410 due to the off-leak in the thin film transistor MI can be effectively prevented from occurring.

<1.5 Modified Examples>

The following describes modified examples of the bistable circuit according to the first embodiment. In the first embodiment, the source terminal of the thin film transistor ME1 is connected to the input terminal 44 for receiving the third clock CKC. However, this source terminal can be connected to the input terminal 43 for receiving the second clock CKB. Further, in the first embodiment, the source terminals of the thin film transistors ML, MN, MJ, and ME1 are connected to one of the input terminals 43 and 44. However, it is possible to provide a configuration in which a direct-current voltage equals to a voltage when the gate clock signal GCK is at the low level is applied to these source terminals. Moreover, in the first embodiment, the gate terminal of the thin film transistor MJ is connected to the netA. However, this gate terminal can be connected to the input terminal 41 for receiving the start signal S.

Figure 10:
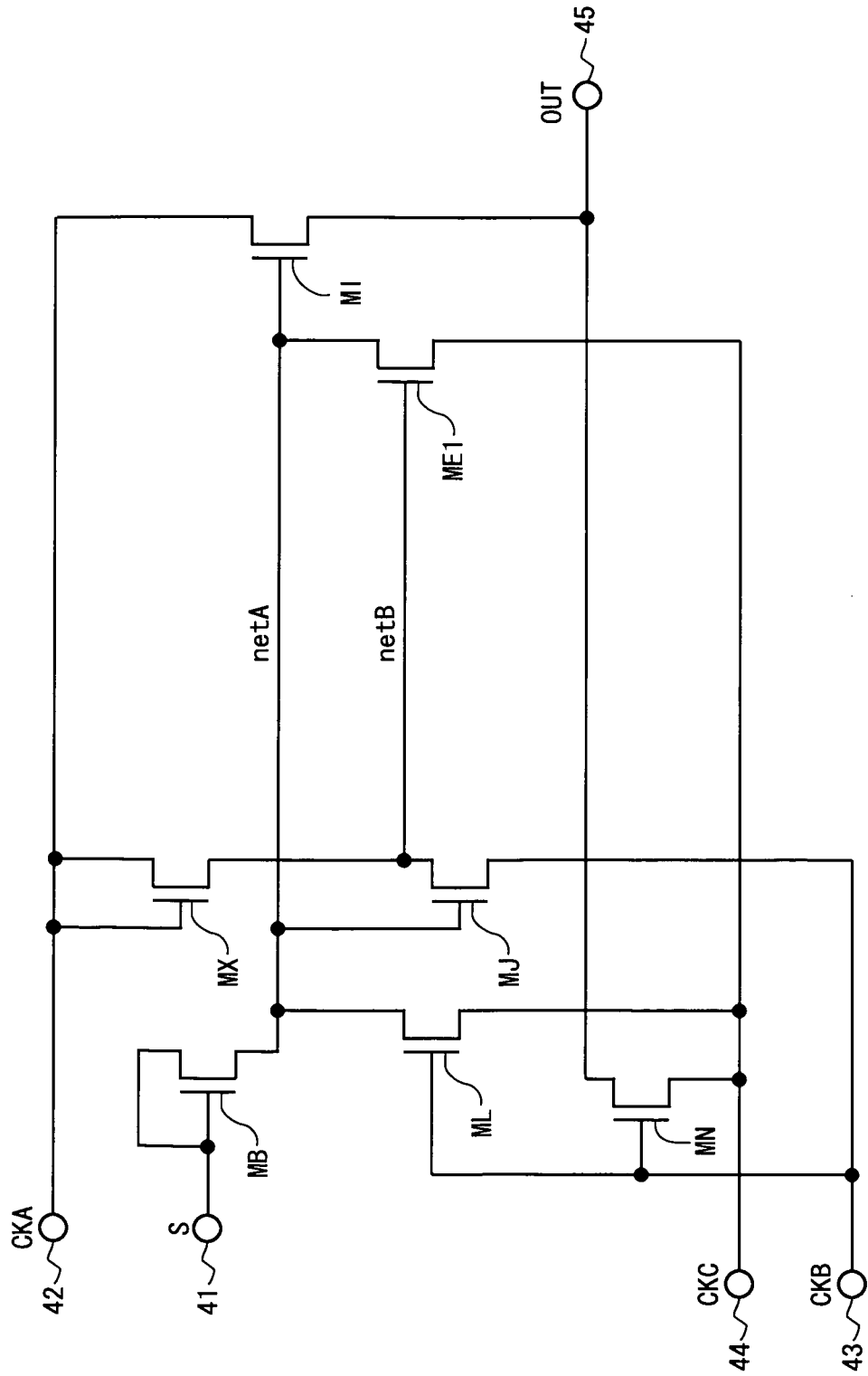
FIG. 10 is a circuit diagram illustrating a configuration of a bistable circuit according to the modification of the first embodiment.
Figure 11:
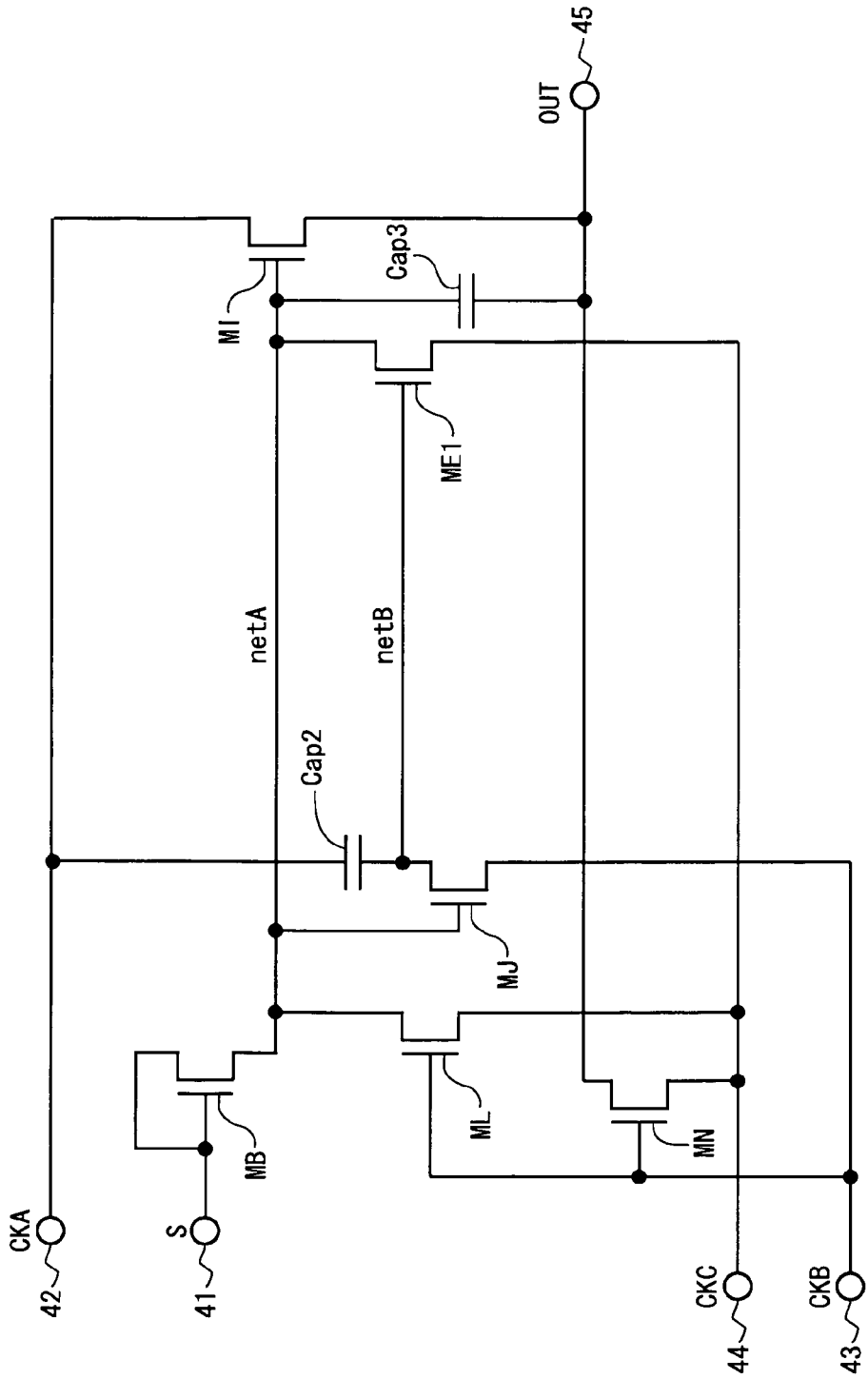
FIG. 11 is a circuit diagram illustrating a configuration of a bistable circuit according to the modification of the first embodiment.

Furthermore, in the first embodiment, the input terminal 42 for receiving the first clock CKA and the netB are connected via the capacitor Cap2. However, it is possible to provide a configuration in which the input terminal 42 and the netB are connected via a diode-connected thin film transistor MX (thirteenth switching element) as shown in FIG. 10, in place of the capacitor Cap2. Alternatively, it is possible to provide the diode-connected thin film transistor in parallel with the capacitor Cap2. In addition, as shown in FIG. 11, it is possible to provide a capacitor Cap1 between the gate terminal of the thin film transistor MI and the output terminal 45.

<2. Second Embodiment>

<2.1 Overall Configuration and the Like>

An overall configuration, a configuration in outline of a gate driver, and a configuration of a shift register according to this embodiment are the same as those described in the first embodiment with reference to FIG. 2 to FIG. 4, and therefore explanations thereof are omitted. Further, waveforms of first to third gate clock signals as well as of scanning signals are the same as those described in the first embodiment with reference to FIG. 5 and FIG. 6, and therefore explanations thereof are omitted.

<2.2 Configuration and Operation of Bistable Circuit>

Figure 12:
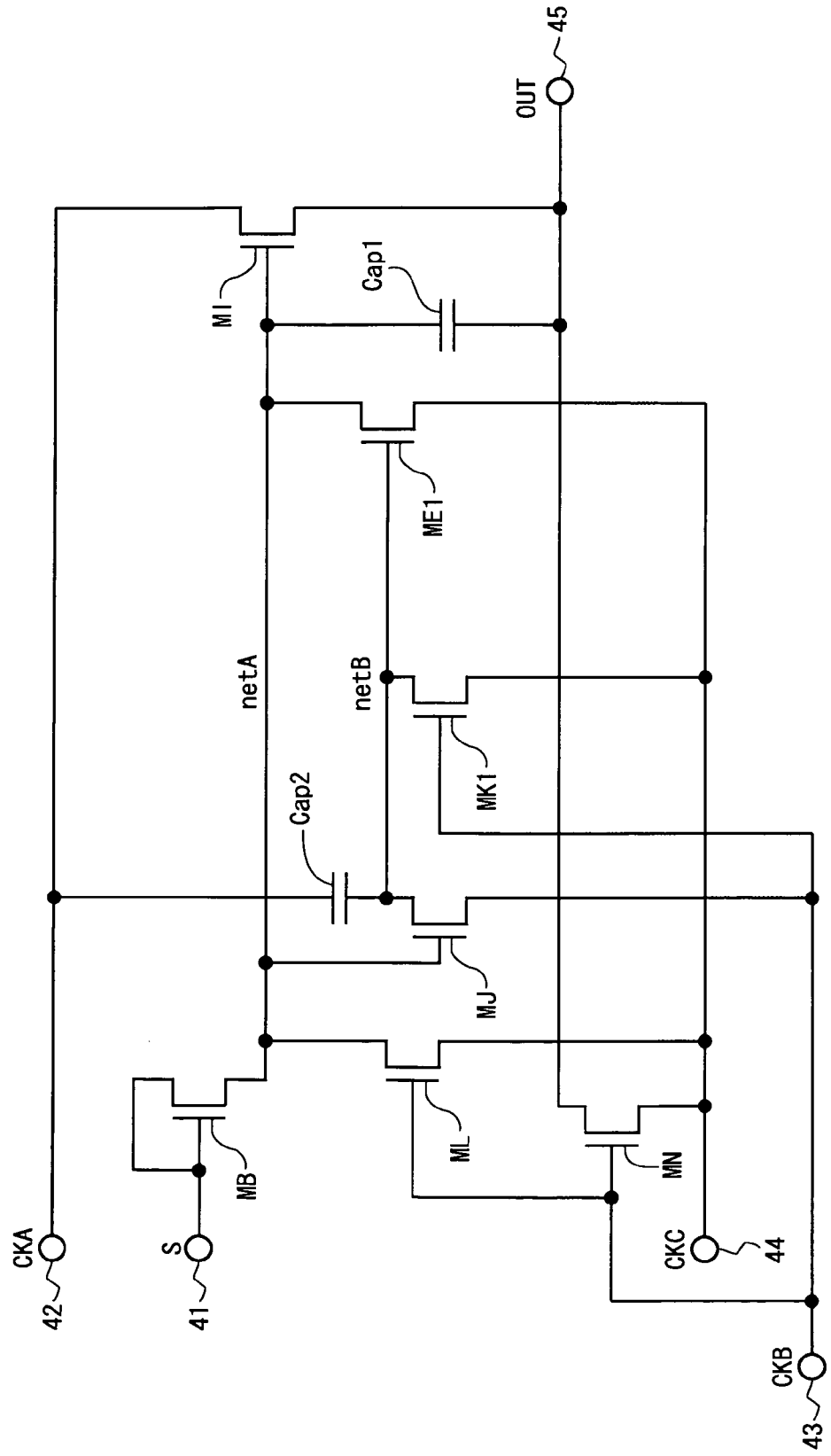
FIG. 12 is a circuit diagram illustrating a configuration of a bistable circuit included in a shift register within a gate driver of a liquid crystal display device according to a second embodiment of the present invention.

FIG. 12 is a circuit diagram illustrating a configuration of a bistable circuit according to this embodiment. In this embodiment, a thin film transistor MK1 (ninth switching element) and a capacitor Cap1 are provided, in addition to the components described in the first embodiment with reference to FIG. 1. Regarding the thin film transistor MK1, a gate terminal thereof is connected to the input terminal 43, a drain terminal thereof is connected to the netB, and a source terminal thereof is connected to the input terminal 44. Regarding the capacitor Cap1, one end thereof is connected to the netA, and the other end thereof is connected to the output terminal 45. Note that, a second second-node discharge unit is implemented by the thin film transistor MK1.

Next, an operation of the bistable circuit is described with reference to FIG. 7, FIG. 12, and FIG. 13, focusing on differences from the first embodiment. As the gate terminal of the thin film transistor MK1 is connected to the input terminal 43 for receiving the second clock CKB, the thin film transistor MK1 is in the ON state during the period such as periods of t2 to t3 and t5 to t6 in which the second clock CKB is at the high level (see fields indicated by a reference numeral 80 in FIG. 13). During these periods, as the third clock CKC is maintained at the low level, the potential of the netB decreases without fail. Further, in this embodiment, the capacitor Cap1 is provided between the netA and the output terminal 45. For this reason, during a period in which active scanning signals are outputted from the output terminal 45 (the period during which the state signal OUT is at the high level), a decrease of the potential of the netA due to off-leak of the thin film transistors ML and ME1 can be suppressed.

<2.3 Effects>

According to this embodiment, by providing the thin film transistor MK1, it is possible to decrease the potential of the netB without fail after the potential of the netB increases as, for example, in the period of t4 to t5. For this reason, degradation of the thin film transistor ME1 can be suppressed, and a malfunction of the shift register can be prevented from occurring. Further, by providing the capacitor Cap1, the decrease of the potential of the netA can be suppressed during a period in which the active scanning signal is outputted from the output terminal 45. For this reason, a voltage level when the scanning signal is at the high level can be maintained at sufficiently high level, and insufficient writing (writing defect) of a video signal to the pixel capacitance can be prevented from occurring.

<2.4 Modified Examples>

The following describes modified examples of the bistable circuit according to the second embodiment. In the second embodiment, the gate terminal of the thin film transistor MK1 is connected to the input terminal 43 for receiving the second clock CKB, and the source terminal of the thin film transistor MK1 is connected to the input terminal 44 for receiving the third clock CKC. However, it is possible to provide a configuration in which the relevant gate terminal is connected to the input terminal 44, and the relevant source terminal is connected to the input terminal 43. Further, similarly to the modified example of the first embodiment, the source terminal of the thin film transistor ME1 can be connected to the input terminal 43. Moreover, in the second embodiment, the source terminals of the thin film transistors ML, MN, MJ, MK1, and ME1 are connected to one of the input terminals 43 and 44. However, it is possible to provide a configuration in which a direct-current voltage equals to a voltage when the gate clock signal GCK is at the low level is applied to these source terminals. Furthermore, similarly to the modified example of the first embodiment (see FIG. 10), it is possible to provide a configuration in which the input terminal 42 and the netB are connected via a diode-connected thin film transistor, in place of the capacitor Cap2. Alternatively, it is possible to provide the diode-connected thin film transistor in parallel with the capacitor Cap2.

<3. Third Embodiment>

<3.1 Overall Configuration and the Like>

An overall configuration and a configuration in outline of a gate driver according to this embodiment are the same as those described in the first embodiment with reference to FIG. 2 and FIG. 3, and therefore explanations thereof are omitted. Further, waveforms of first to third gate clock signals as well as of scanning signals are the same as those described in the first embodiment with reference to FIG. 5 and FIG. 6, and therefore explanations thereof are omitted.

Figure 14:
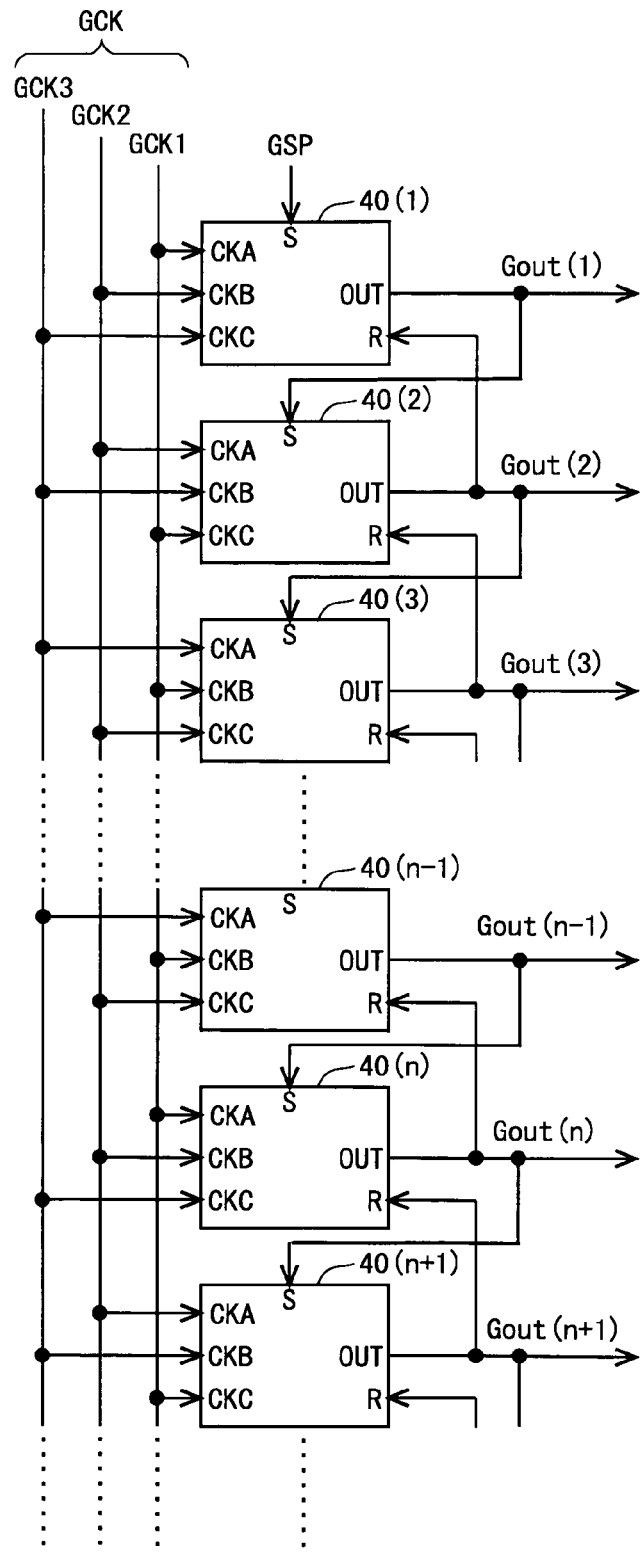
FIG. 14 is a block diagram illustrating a configuration of a shift register within a gate driver of a liquid crystal display device according to a third embodiment of the present invention.

FIG. 14 is a block diagram illustrating a configuration of the shift register 410 within the gate driver 400 according to this embodiment. In this embodiment, each bistable circuit is provided with an input terminal for receiving a reset signal R, in addition to the input terminals and the output terminal described in the first embodiment. In addition, the input terminal for receiving the reset signal R is configured to be supplied with the state signal OUT that is outputted in the next stage.

<3.2 Configuration and Operation of Bistable Circuit>

Figure 15:
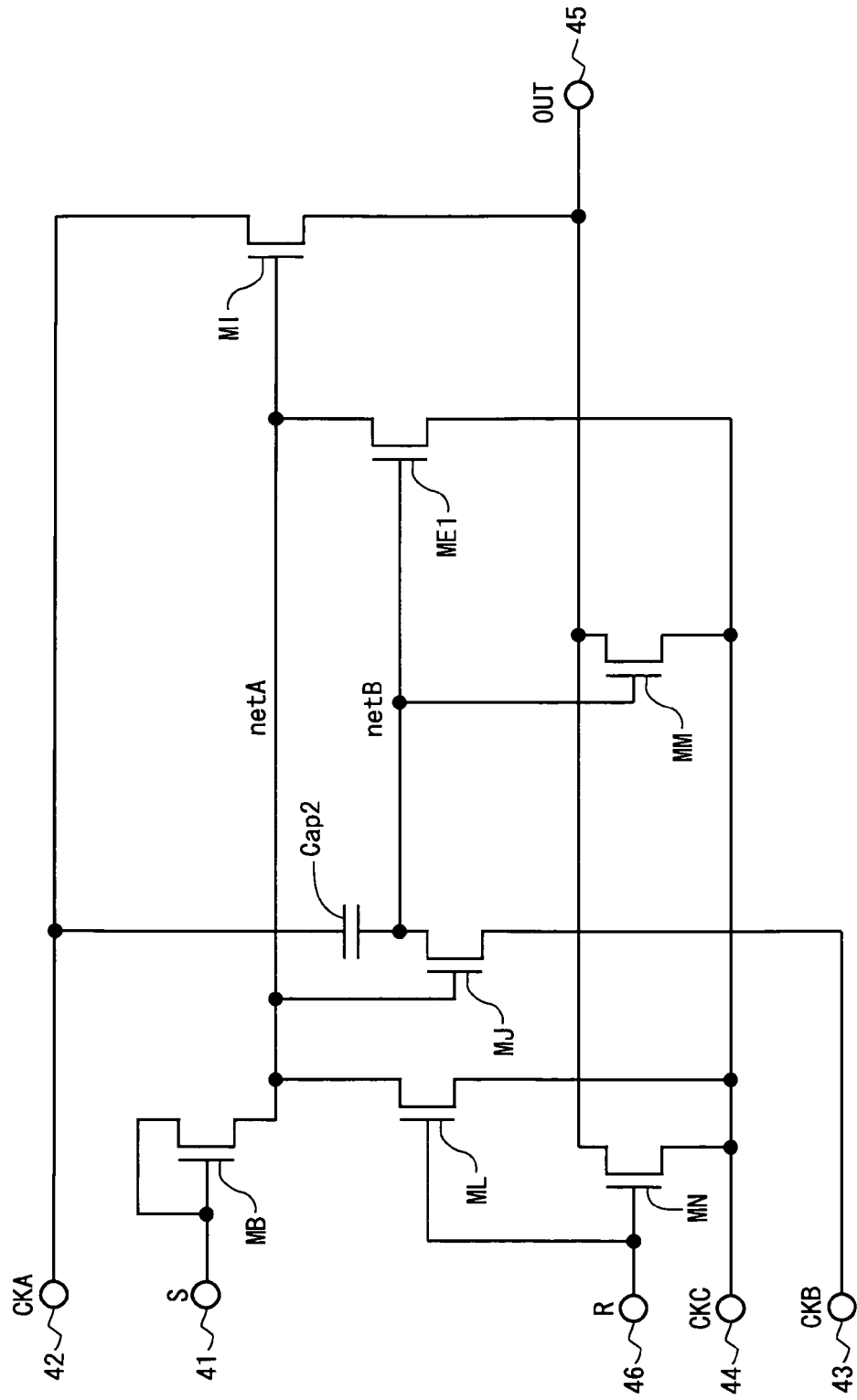
FIG. 15 is a circuit diagram illustrating a configuration of a bistable circuit included in the shift register within the gate driver of the liquid crystal display device according to the third embodiment of the present invention.

FIG. 15 is a circuit diagram illustrating a configuration of the bistable circuit according to this embodiment. In this embodiment, a thin film transistor MM (seventh switching element) is provided, in addition to the components described in the first embodiment with reference to FIG. 1. Regarding the thin film transistor MM, a gate terminal thereof is connected to the netB, a drain terminal thereof is connected to the output terminal 45, and a source terminal thereof is connected to the input terminal 44. Further, although the gate terminals of the thin film transistors ML and MN are connected to the input terminal 43 for receiving the second clock CKB in the first embodiment, these gate terminals are connected to an input terminal 46 for receiving the reset signal R in this embodiment. Note that, a second output-node discharge unit is implemented by the thin film transistor MM.

Figure 16:
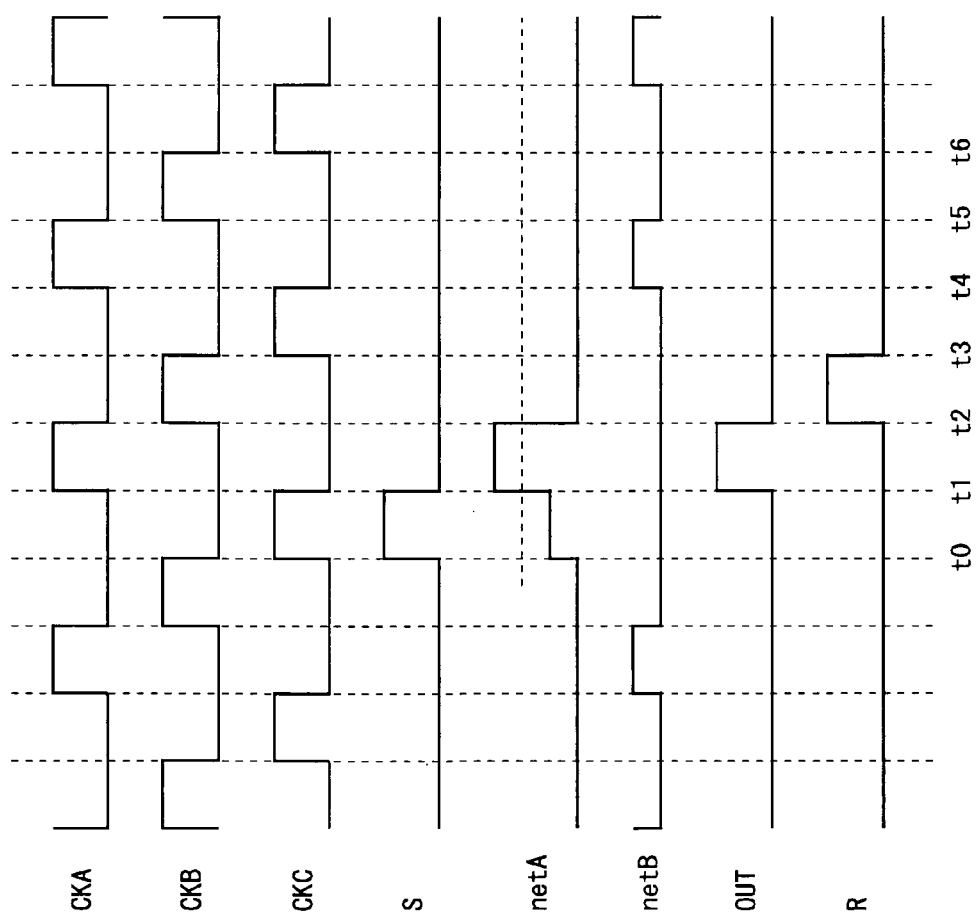
FIG. 16 is a waveform chart for explaining an operation of the bistable circuit according to the third embodiment.

Next, an operation of the bistable circuit is described with reference to FIG. 15, FIG. 16, and FIG. 17. As shown in FIG. 16, during the operation of the liquid crystal display device, the first clock CKA, the second clock CKB, and the third clock CKC are supplied to the input terminals 42 to 44, respectively. At a time point t0, the pulse of the start signal S is supplied to the input terminal 41. As the thin film transistor MB is diode-connected, the netA is precharged by the pulse of the start signal S during a period of t0 to t1. During this period, the thin film transistors ML and ME1 are maintained in an OFF state, as the thin film transistor MJ is maintained in an ON state and the reset signal R and the first clock CKA are at the low level. For this reason, the potential of the netA that has increased by the precharge does not decrease during this period.

At a time point t1, the first clock CKA changes from the low level to the high level. Here, the source terminal of the thin film transistor MI is connected to the input terminal 42, and a parasitic capacitance occurs between the gate and the source of the thin film transistor MI as described above. For this reason, according to an increase of the source potential of the thin film transistor MI, the potential of the netA also increases (the netA is bootstrapped). As a result, the thin film transistor MI is turned to the ON state. As the state in which the first clock CKA is at the high level is maintained until a time point t2, the state signal OUT is at the high level during a period of t1 to t2. This turns the gate bus line connected to the bistable circuit that outputs the state signal OUT at the high level to the selected state, and a video signal is written to the pixel capacitance Cp in the pixel formation portion of the line corresponding to this gate bus line. During the period of t1 to t2, the thin film transistor MJ is maintained in the ON state, and the second clock CKB is maintained at the low level. For this reason, the potential of the netB is maintained at the low level. Further, during this period, as the reset signal R is maintained at the low level, the thin film transistors ML and MN are maintained in the OFF state. For this reason, the potentials of the netA and the state signal OUT (output terminal 45) do not decrease during this period.

At the time point t2, the first clock CKA changes from the high level to the low level. In addition, the reset signal R changes from the low level to the high level. This turns the thin film transistors ML and MN to the ON state. The state in which the reset signal R is at the high level is maintained until a time point t3. Further, during a period of t2 to t3, the third clock CKC is maintained at the low level. For this reason, the potential of the netA decreases as the thin film transistor ML is turned to the ON state, and the potential of the state signal OUT decreases as the thin film transistor MN is turned to the ON state.

During a period of t3 to t4, as the first clock CKA and the start signal S are maintained at the low level, the potential of the netA does not increase, and the state signal OUT is maintained at the low level.

At a time point t4, the first clock CKA changes from the low level to the high level. Here, as the input terminal 42 and the netB are connected via the capacitor Cap2, the potential of the netB increases as the potential of the input terminal 42 increases. This turns the thin film transistors ME1 and MM to the ON state. Further, during a period of t4 to t5, the third clock CKC is maintained at the low level. For this reason, the potential of the netA is maintained at the low level as the thin film transistor ME1 is in the ON state, regardless of the presence of the above-described parasitic capacitance Cgs.

Accordingly, during the period of t4 to t5, the thin film transistor MI is not turned to the ON state, and the state signal OUT is maintained at the low level. Further, even when the potential of the state signal OUT has increased due to the off-leak of the thin film transistor MI, as the thin film transistor MM is in the ON state, the increased potential decreases during this period. Therefore, during the period of t4 to t5, the state signal OUT is maintained at the low level.

During a period of t5 to t6, as the first clock CKA and the start signal S are maintained at the low level, the state signal OUT is maintained at the low level similarly to the case of the period of t2 to t3. During a period after a time point t6, the operations that are carried out during the periods of t3 to t6 are repeated until the pulse of the start signal S is next supplied to the input terminal 41.

<3.3 Effects>

According to this embodiment, similarly to the first embodiment, even in a case in which a thin film transistor of relatively large off-leak such as a thin film transistor using microcrystalline silicon is employed as a driver element, there is no malfunction of the shift register 410 nor a display defect due to the off-leak of the thin film transistor. Further, similarly to the first embodiment, a malfunction of the shift register due to degradation of the thin film transistors can be prevented from occurring. Moreover, similarly to the first embodiment, as the duty ratio of the first clock CKA becomes one third, a malfunction of the shift register 410 due to the off-leak in the thin film transistor MI can be effectively prevented from occurring.

Furthermore, according to this embodiment, the gate terminals of the thin film transistor ML for controlling the potential of the netA and of the thin film transistor MN for controlling the potential of the state signal OUT are supplied with the reset signal R that becomes high level only once (single horizontal scanning period) in a single frame period. For this reason, degradation of the thin film transistors ML and MN can be suppressed, and a malfunction of the shift register can be effectively prevented from occurring. Further, by providing the thin film transistor MM for decreasing the potential of the state signal OUT during the period in which the first clock CKA is at the high level (excluding the period in which the gate bus line should be in the selected state), even when an off-leak occurs in the thin film transistor MI, the potential of the state signal OUT can be maintained at the low level during the period in which the gate bus line should be maintained in the unselected state. Therefore, an occurrence of a display defect can be suppressed.

<3.4 Modified Examples>

The following describes modified examples of the bistable circuit according to the third embodiment. In the third embodiment, the source terminals of the thin film transistor MM and ME1 are connected to the input terminal 44 for receiving the third clock CKC. However, these source terminals can be connected to the input terminal 43 for receiving the second clock CKB. Further, in the third embodiment, the source terminals of the thin film transistors ML, MN, MJ, MM, and ME1 are connected to one of the input terminals 43 and 44. However, it is possible to provide a configuration in which a direct-current voltage equals to a voltage when the gate clock signal GCK is at the low level is applied to these source terminals. Moreover, similarly to the modified example of the first embodiment (see FIG. 10), it is possible to provide a configuration in which the input terminal 42 and the netB are connected via a diode-connected thin film transistor, in place of the capacitor Cap2. Alternatively, it is possible to provide the diode-connected thin film transistor in parallel with the capacitor Cap2. Furthermore, similarly to the modified example of the first embodiment (see FIG. 11), it is possible to provide the capacitor Cap1 between the gate terminal of the thin film transistor MI and the output terminal 45.

<4. Fourth Embodiment>

<4.1 Overall Configuration and the Like>

An overall configuration and a configuration in outline of a gate driver according to this embodiment are the same as those described in the first embodiment with reference to FIG. 2 and FIG. 3, and therefore explanations thereof are omitted. Further, waveforms of first to third gate clock signals as well as of scanning signals are the same as those described in the first embodiment with reference to FIG. 5 and FIG. 6, and therefore explanations thereof are omitted. A configuration of a shift register is the same as that described in the third embodiment with reference to FIG. 14, and therefore an explanation thereof is omitted.

<4.2 Configuration and Operation of Bistable Circuit>

Figure 18:
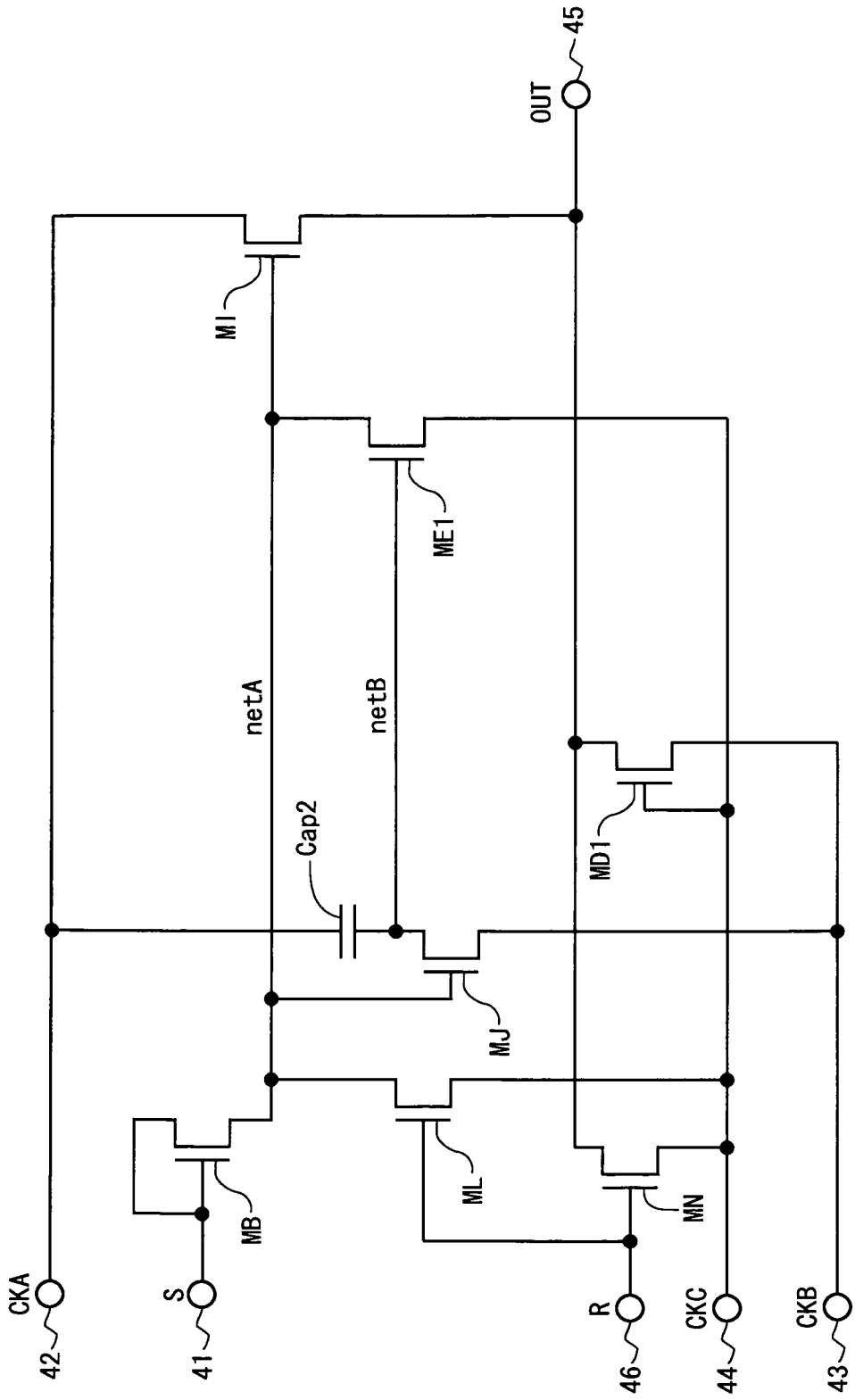
FIG. 18 is a circuit diagram illustrating a configuration of a bistable circuit included in a shift register within a gate driver of a liquid crystal display device according to a fourth embodiment of the present invention.

FIG. 18 is a circuit diagram illustrating a configuration of a bistable circuit according to this embodiment. In this embodiment, as compared to the components of the third embodiment with reference to FIG. 15, a thin film transistor MD1 (eighth switching element) is provided as a component for decreasing the potential of the state signal OUT, in place of the thin film transistor MM. Regarding the thin film transistor MD1, a gate terminal thereof is connected to the input terminal 44, a drain terminal thereof is connected to the output terminal 45, and a source terminal thereof is connected to the input terminal 43. Note that, a third output-node discharge unit is implemented by the thin film transistor MD1.

Next, an operation of the bistable circuit is described with reference to FIG. 16, FIG. 18, and FIG. 19, focusing on differences from the third embodiment. In the third embodiment, the potential of the state signal OUT is fixed to the low level by turning the thin film transistor MM to the ON state when the potential of the netB increases. In contrast, according to this embodiment, the state signal OUT is fixed to the low level by turning the thin film transistor MD1 to the ON state when the third clock CKC is turned to the high level (see fields indicated by a reference numeral 81 in FIG. 19).

<4.3 Effects>

According to this embodiment, it is possible to obtain an effect that the state signal OUT can be fixed to the low level without placing any load on the netB, in addition to the effects similar to those of the third embodiment.

<4.4 Modified Examples>

The following describes modified examples of the bistable circuit according to the fourth embodiment. In the fourth embodiment, the gate terminal of the thin film transistor MD1 is connected to the input terminal 44 for receiving the third clock CKC, and the source terminal of the thin film transistor MD1 is connected to the input terminal 43 for receiving the second clock CKB. However, it is possible to provide a configuration in which the relevant gate terminal is connected to the input terminal 43, and the relevant source terminal is connected to the input terminal 44. Further, although the source terminal of the thin film transistor ME1 is connected to the input terminal 44 in the fourth embodiment, this source terminal can be connected to the input terminal 43. Moreover, in the fourth embodiment, the source terminals of the thin film transistors ML, MN, MJ, MD1, and ME1 are connected to one of the input terminals 43 and 44. However, it is possible to provide a configuration in which a direct-current voltage equals to a voltage when the gate clock signal GCK is at the low level is applied to these source terminals. Furthermore, similarly to the modified example of the first embodiment (see FIG. 10), it is possible to provide a configuration in which the input terminal 42 and the netB are connected via a diode-connected thin film transistor, in place of the capacitor Cap2. Alternatively, it is possible to provide the diode-connected thin film transistor in parallel with the capacitor Cap2. In addition, similarly to the modified example of the first embodiment (see FIG. 11), it is possible to provide the capacitor Cap1 between the gate terminal of the thin film transistor MI and the output terminal 45.

Further, similarly to the third embodiment, it is possible to provide the thin film transistor MM whose gate terminal is connected to the netB, and whose drain terminal is connected to the output terminal 45. In this case, the source terminal of the thin film transistor MM is preferably connected to the input terminal that is connected to the gate terminal of the thin film transistor MD1. Moreover, it is possible to provide a configuration in which the gate terminals of the thin film transistors ML and MN are supplied with the second clock CKB, in place of the reset signal R.

<5. Fifth Embodiment>
<5.1 Overall Configuration and the Like>

An overall configuration and a configuration in outline of a gate driver according to this embodiment are the same as those described in the first embodiment with reference to FIG. 2 and FIG. 3, and therefore explanations thereof are omitted. Further, waveforms of first to third gate clock signals as well as of scanning signals are the same as those described in the first embodiment with reference to FIG. 5 and FIG. 6, and therefore explanations thereof are omitted. A configuration of a shift register is the same as that described in the third embodiment with reference to FIG. 14, and therefore an explanation thereof is omitted.

<5.2 Configuration and Operation of Bistable Circuit>

Figure 20:
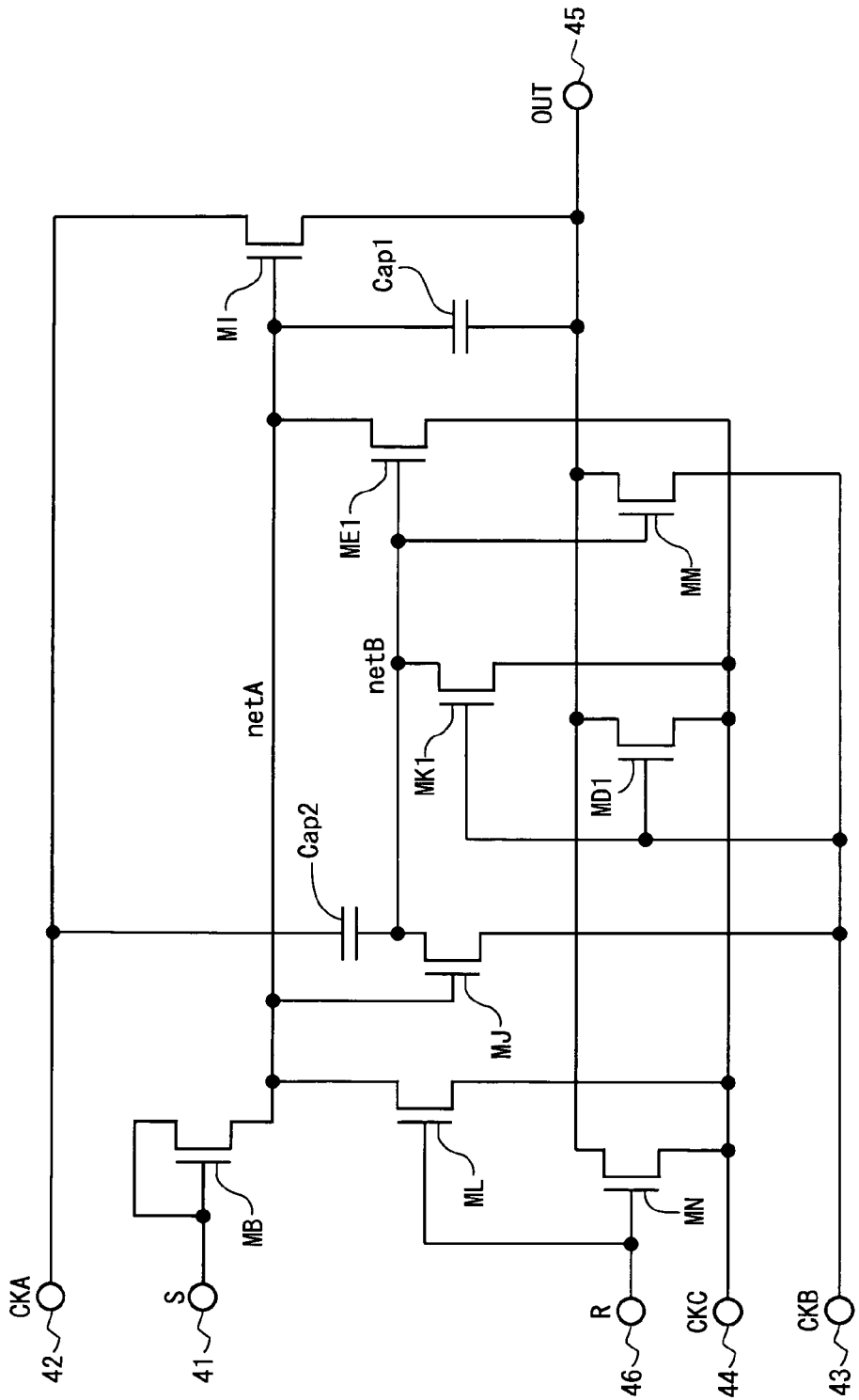
FIG. 20 is a circuit diagram illustrating a configuration of a bistable circuit included in a shift register within a gate driver of a liquid crystal display device according to a fifth embodiment of the present invention.

FIG. 20 is a circuit diagram illustrating a configuration of a bistable circuit according to this embodiment. In this embodiment, thin film transistors MK1 and MD1 and a capacitor Cap1 are provided, in addition to the components described in the third embodiment with reference to FIG. 15. Further, the source terminal of the thin film transistor MM is connected to the input terminal 43 according to this embodiment, although the source terminal of the thin film transistor MM is connected to the input terminal 44 in the third embodiment. Regarding the thin film transistor MK1, a gate terminal thereof is connected to the input terminal 43, a drain terminal thereof is connected to the netB, and a source terminal thereof is connected to the input terminal 44. Regarding the thin film transistor MD1, a gate terminal thereof is connected to the input terminal 43, a drain terminal thereof is connected to the output terminal 45, and a source terminal thereof is connected to the input terminal 44. Regarding the capacitor Cap1, one end thereof is connected to the netA, and the other end thereof is connected to the output terminal 45.

Next, an operation of the bistable circuit is described with reference to FIG. 16, FIG. 20, and FIG. 21, focusing on differences from the third embodiment. As the gate terminal of the thin film transistor MK1 is connected to the input terminal 43 for receiving the second clock CKB, the thin film transistor MK1 is in the ON state during the period such as periods of t2 to t3 and t5 to t6 in which the second clock CKB is at the high level (see fields indicated by a reference numeral 82 in FIG. 21). During these periods, as the third clock CKC is maintained at the low level, the potential of the netB is fixed to the low level. Further, as the gate terminal of the thin film transistor MD1 is also connected to the input terminal 43, the thin film transistor MD1 is in the ON state during the period in which the second clock CKB is at the high level. During these periods, as the third clock CKC is maintained at the low level, the potential of the state signal OUT is fixed to the low level. Moreover, in this embodiment, the capacitor Cap1 is provided between the netA and the output terminal 45. For this reason, during a period in which active scanning signal is outputted from the output terminal 45, a decrease of the potential of the netA due to off-leak in the thin film transistors ML and ME1 can be suppressed.

<5.3 Effects>

According to this embodiment, by providing the thin film transistor MK1, it is possible to decrease the potential of the netB without fail after the potential of the netB increases as, for example, in the period of t4 to t5. For this reason, degradation of the thin film transistor ME1 can be suppressed, and a malfunction of the shift register can be prevented from occurring. Further, by providing the thin film transistor MD1, even in a case in which the potential of the state signal OUT increases due to the occurrence of an off-leak in the thin film transistor MI when the potential of the first clock CKA increases, it is possible to decrease the potential of the state signal OUT without fail during the period in which the second clock CKB is at the high level. For this reason, a malfunction of the shift register due to the off-leak in the thin film transistor MI can be prevented from occurring. Moreover, by providing the capacitor Cap1, the decrease of the potential of the netA can be suppressed during a period in which the active scanning signal is outputted from the output terminal 45. For this reason, a voltage level when the scanning signal is at the high level can be maintained at the sufficiently high level, and insufficient writing (writing defect) of a video signal to the pixel capacitance can be prevented from occurring.

Figure 22:
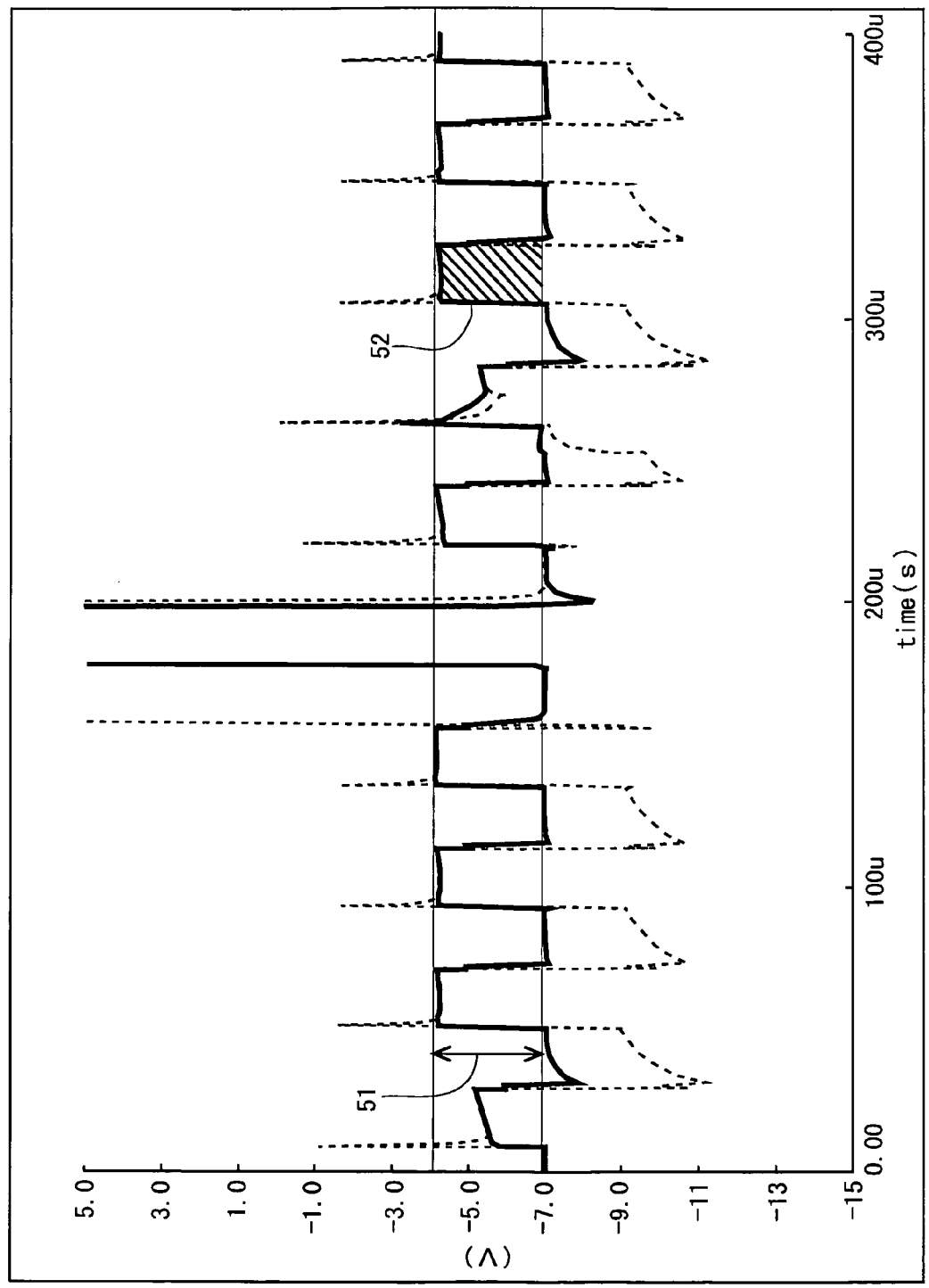
FIG. 22 is a chart showing a result of a simulation according to the conventional example.
Figure 23:
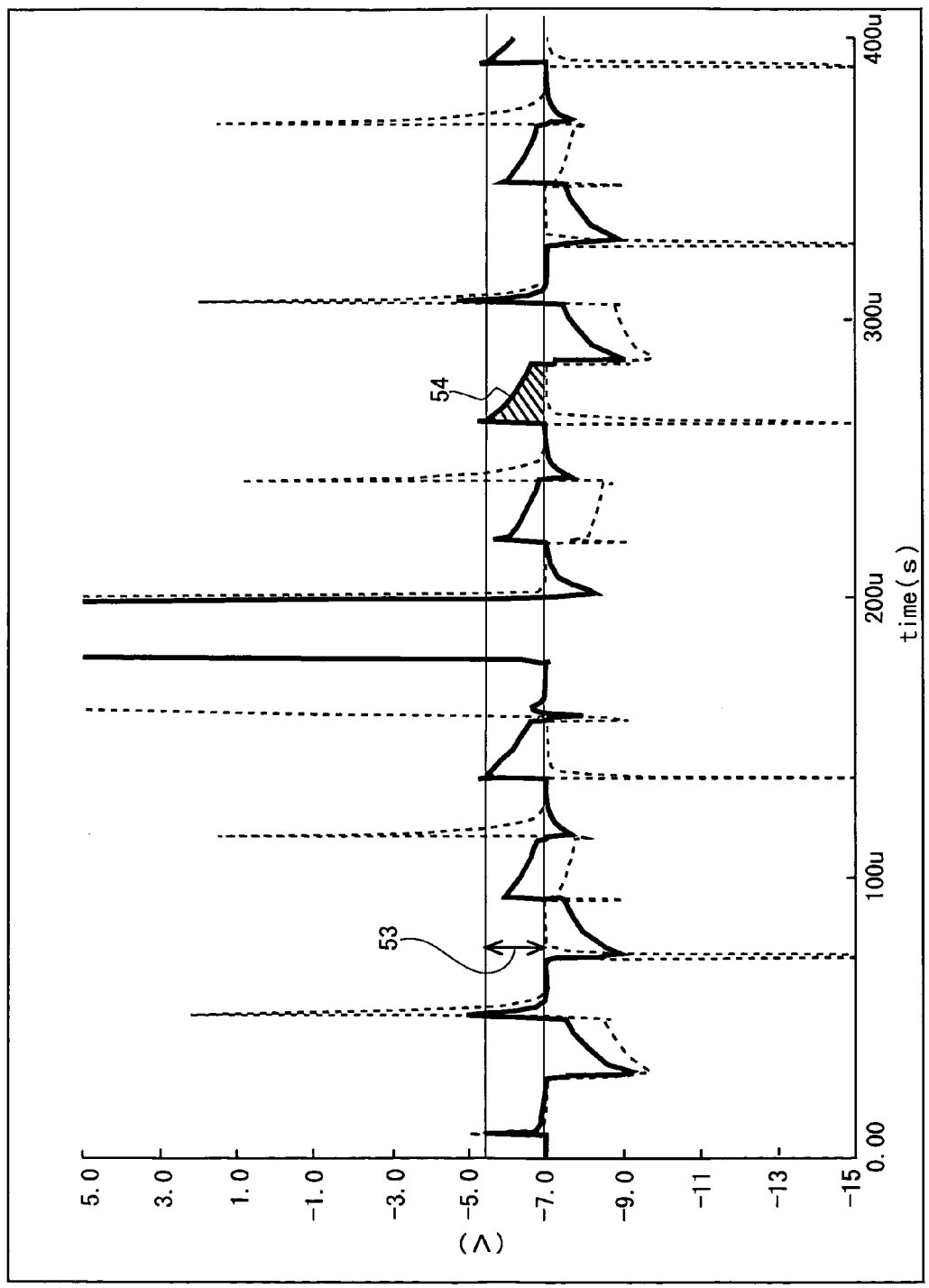
FIG. 23 is a chart showing a result of a simulation according to the fifth embodiment.

FIG. 22 and FIG. 23 are charts for explaining the effects according to this embodiment. FIG. 22 is the chart showing a result of a simulation according to the conventional example (the configuration in which the loop shown in FIG. 28 is formed). FIG. 23 is the chart showing a result of a simulation according to this embodiment. In each of FIG. 22 and FIG. 23, a heavy solid line indicates a variation in the potential of the state signal OUT, and a dashed line indicates a variation in the potential of the netA. Further, the vertical axis indicates the potential and the horizontal axis indicates the time. The low level of the clock signal is taken as −7.0 V.

As indicated by a reference numeral 51 in FIG. 22, in the conventional example, the variation in the potential of the state signal OUT was about 2.8 V. In contrast, as indicated by a reference numeral 53 in FIG. 23, in this embodiment, the variation in the potential of the state signal OUT is about 1.6 V. Further, comparing an area of a shaded region (a variation range of the potential toward a positive direction from the low level of the clock signal×time) indicated by a reference numeral 52 in FIG. 22 with an area of a shaded region indicated by a reference numeral 54 in FIG. 23, it can be seen that the area in this embodiment is considerably smaller than the area in the conventional example. When the potential of the clock signal continues to change toward the positive direction from the low level, the shift register often operates abnormally or an insufficient charge possibly occurs due to a leak current occurring in the thin film transistor that is connected to the gate bus line in the pixel formation portion. In this regard, based on the results of the simulations shown in FIG. 22 and FIG. 23, it can be seen that an abnormal operation of the shift register and an insufficient charge in the pixel capacitance can be prevented from occurring according to this embodiment, as compared to the conventional example.

<5.4 Modified Examples>

The following describes modified examples of the bistable circuit according to the fifth embodiment. In the fifth embodiment, the gate terminal of the thin film transistor MD1 is connected to the input terminal 43 for receiving the second clock CKB, and the source terminal of the thin film transistor MD1 is connected to the input terminal 44 for receiving the third clock CKC. However, it is possible to provide a configuration in which the relevant gate terminal is connected to the input terminal 44, and the relevant source terminal is connected to the input terminal 43. Further, similarly to the modified example according to the second embodiment, it is possible to provide a configuration in which the gate terminal of the thin film transistor MK1 is connected to the input terminal 44, and the source terminal of the thin film transistor MK1 is connected to the input terminal 43. Moreover, in the fifth embodiment, the source terminals of the thin film transistors ML, MN, MJ, MM, MD1, MK1, and ME1 are connected to one of the input terminals 43 and 44. However, it is possible to provide a configuration in which a direct-current voltage equals to a voltage when the gate clock signal GCK is at the low level is applied to these source terminals. Furthermore, similarly to the modified example of the first embodiment (see FIG. 10), it is possible to provide a configuration in which the input terminal 42 and the netB are connected via a diode-connected thin film transistor, in place of the capacitor Cap2. Alternatively, it is possible to provide the diode-connected thin film transistor in parallel with the capacitor Cap2. In addition, it is possible to provide a configuration in which one of the thin film transistors MD1 and MM is removed from the components illustrated in FIG. 20.

<6. Sixth Embodiment>
<6.1 Overall Configuration and the Like>

An overall configuration, a configuration in outline of a gate driver, a configuration of a source driver, waveforms of first to third gate clock signals, and waveforms of scanning signals are the same as those described in the fifth embodiment, and therefore explanations thereof are omitted.

<6.2 Configuration and Operation of Bistable Circuit>

Figure 24:
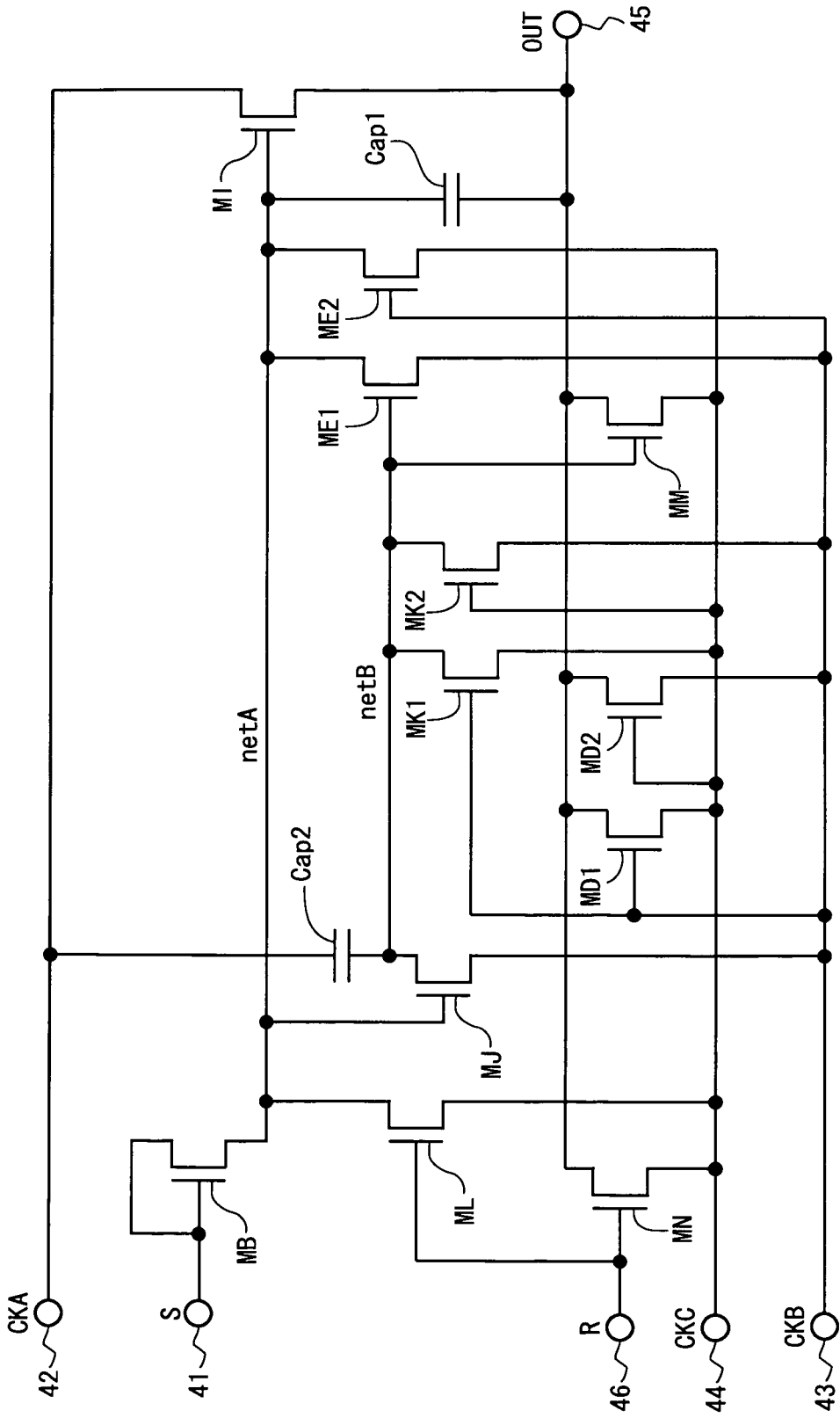
FIG. 24 is circuit diagram illustrating a configuration of a bistable circuit included in a shift register within a gate driver of a liquid crystal display device according to a sixth embodiment of the present invention.

FIG. 24 is a circuit diagram illustrating a configuration of a bistable circuit according to this embodiment. In this embodiment, thin film transistors MD2 (tenth switching element), ME2 (eleventh switching element), and MK2 (twelfth switching element) are provided, in addition to the components described in the fifth embodiment with reference to FIG. 20. Regarding the thin film transistor MK2, a gate terminal thereof is connected to the input terminal 44, a drain terminal thereof is connected to the netB, and a source terminal thereof is connected to the input terminal 43. Regarding the thin film transistor MD2, a gate terminal thereof is connected to the input terminal 44, a drain terminal thereof is connected to the output terminal 45, and a source terminal thereof is connected to the input terminal 43. Regarding the thin film transistor ME2, a gate terminal thereof is connected to the input terminal 43, a drain terminal thereof is connected to the netA, and a source terminal thereof is connected to the input terminal 44.

Note that, a fourth output-node discharge unit is implemented by the thin film transistor MD2, a third first-node discharge unit is implemented by the thin film transistor ME2, and a third second-node discharge unit is implemented by the thin film transistor MK2.

Figure 25:
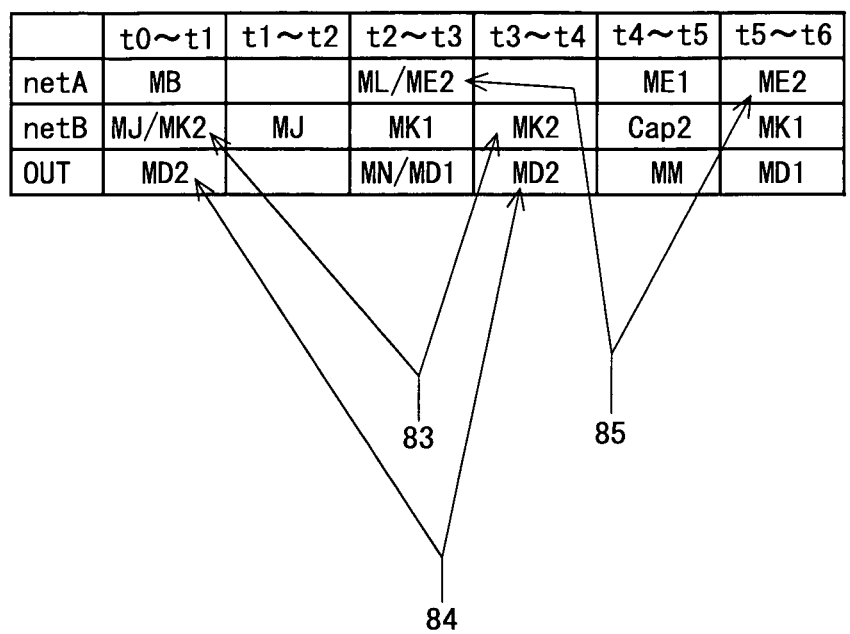
FIG. 25 is a diagram for explaining an operation of the bistable circuit according to the sixth embodiment.

Next, an operation of the bistable circuit is described with reference to FIG. 16, FIG. 24, and FIG. 25, focusing on differences from the fifth embodiment. As the gate terminal of the thin film transistor MK2 is connected to the input terminal 44 for receiving the third clock CKC, the thin film transistor MK2 is in the ON state during the period such as periods of t0 to t1 and t3 to t4 in which the third clock CKC is at the high level (see fields indicated by a reference numeral 83 in FIG. 25). During these periods, as the second clock CKB is maintained at the low level, the potential of the netB is fixed to the low level. Further, as the gate terminal of the thin film transistor MD2 is also connected to the input terminal 44, the thin film transistor MD2 is in the ON state during the period in which the third clock CKC is at the high level (see fields indicated by a reference numeral 84 in FIG. 25). During these periods, as the second clock CKB is maintained at the low level, the potential of the state signal OUT is fixed to the low level. Moreover, as the gate terminal of the thin film transistor ME2 is connected to the input terminal 43 for receiving the second clock CKB, the thin film transistor ME2 is in the ON state during the period in which the second clock CKB is at the high level (see fields indicated by a reference numeral 85 in FIG. 25). During these periods, as the third clock CKC is maintained at the low level, the potential of the netA is fixed to the low level.

<6.3 Effects>

According to this embodiment, the thin film transistors ME1 and ME2 are provided as the components for decreasing the potential of the netA during the period in which the gate bus line should be in the unselected state, and the thin film transistors MK1 and MK2 are provided as the components for decreasing the potential of the netB during this period. This effectively suppresses degradation of the thin film transistor ME1 whose gate terminal is connected to the netB as well as degradation of the thin film transistor MI whose gate terminal is connected to the netA. Further, the thin film transistors MD1, MD2, and MM are provided as the components for decreasing the potential of the state signal OUT during the period in which the gate bus line should be in the unselected state. Accordingly, the potential of the state signal OUT is fixed to the low level without fail during this period, and it is possible to effectively suppresses an occurrence of a display defect.

<6.4 Modified Examples>

The following describes modified examples of the bistable circuit according to the sixth embodiment. The source terminals of the thin film transistors MD1, MD2, MK1, MK2, ME1, ME2, and MM can be connected to any of the input terminals 43 and 44. Further, in the sixth embodiment, the source terminals of the thin film transistors ML, MN, MJ, MM, MK1, MK2, MD1, MD2, ME1, and ME2 are connected to one of the input terminals 43 and 44. However, it is possible to provide a configuration in which a direct-current voltage equals to a voltage when the gate clock signal GCK is at the low level is supplied to these source terminals. Moreover, similarly to the modified example of the first embodiment (see FIG. 10), it is possible to provide a configuration in which the input terminal 42 and the netB are connected via a diode-connected thin film transistor, in place of the capacitor Cap2. Alternatively, it is possible to provide the diode-connected thin film transistor in parallel with the capacitor Cap2. Furthermore, it is possible to provide a configuration in which at least one of the thin film transistors MD2, MK2, and ME2 is removed from the components illustrated in FIG. 24.

<7. Configuration using Multichannel TFT>

Figure 26A:
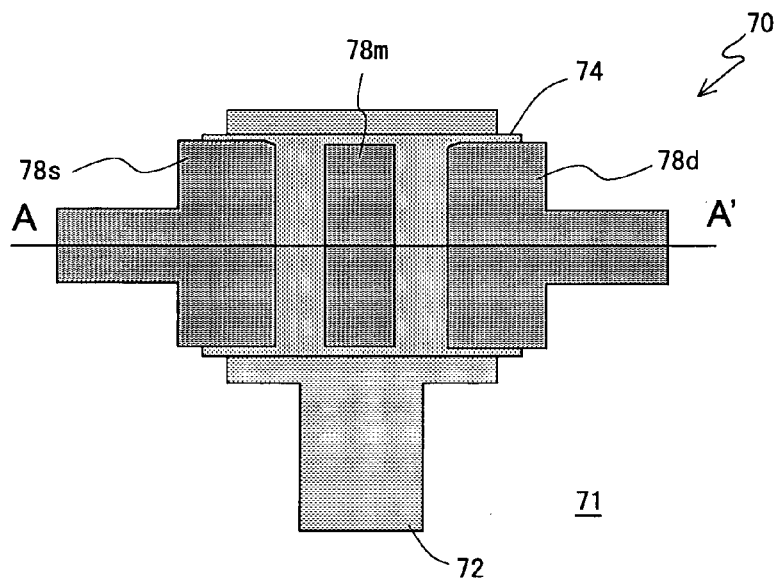
FIG. 26A to FIG. 26C are diagrams for explaining a multichannel TFT.
Figure 26B:
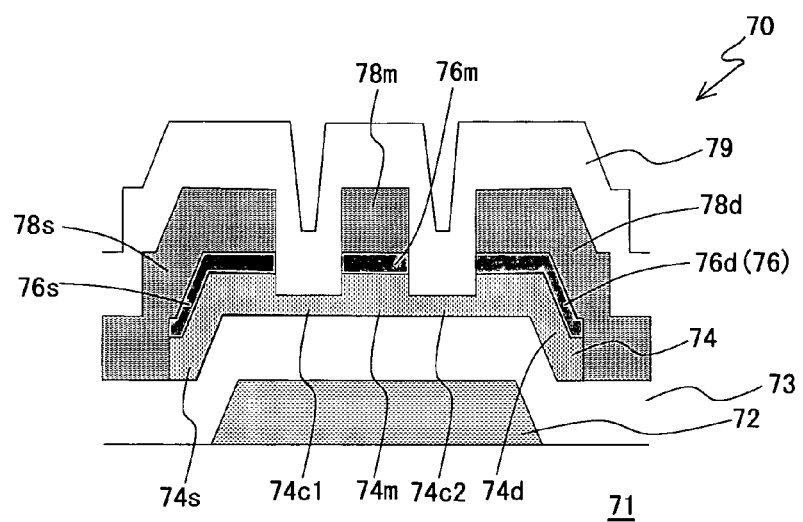

According to the above-described embodiments, when the potential of the netA increases during the period of t1 to t2 (see FIG. 7 and FIG. 16), a high voltage is applied between the source and the drain of the thin film transistors ML and ME1 (see FIG. 1). Therefore, these thin film transistors ML and ME1 can be configured by a multichannel TFT so that any leak current does not occur in the thin film transistors ML and ME1 due to the high voltage. The following describes the multichannel TFT with reference to FIG. 26. Note that, FIG. 26A is a plan view of the multichannel TFT, FIG. 26B is a cross-sectional view taken along line A-A' in FIG. 26A, and FIG. 26C is an equivalent circuit diagram of the multichannel TFT.

Figure 26C:
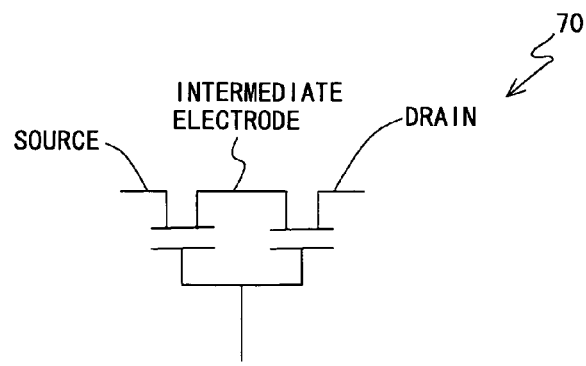

A multichannel TFT 70 has a dual-gate structure (double-gate structure), and has a structure electrically equivalent to two TFTs that are connected in series as shown in FIG. 26C. The multichannel TFT 70 is provided with an active layer 74 supported by a substrate (e.g., glass substrate) 71. The active layer 74 is a semiconductor layer, and includes a microcrystalline silicon (μc-Si) film. The active layer 74 is provided with channel regions 74c1 and 74c2, a source region 74s, a drain region 74d, and an intermediate region 74m sandwiched between the two channel regions 74c1 and 74c2. The multichannel TFT 70 is further provided with a contact layer 76 including a source contact region 76s that is in contact with the source region 74s, a drain contact region 76d that is in contact with the drain region 74d, and an intermediate contact region 76m that is in contact with the intermediate region 74m, a source electrode 78s that is in contact with the source contact region 76s, a drain electrode 78d that is in contact with the drain contact region 76d, an intermediate electrode 78m that is in contact with the intermediate contact region 76m, and a gate electrode 72 that is disposed opposing to the two channel regions 74c1 and 74c2 and the intermediate region 74m with a gate insulating film 73 interposed therebetween. In addition, the multichannel TFT 70 is further provided with a protecting film 79 that covers them. It should be noted that the intermediate electrode 78m is in a floating state.

The channel region 74c1 is formed between the source region 74s and the intermediate region 74m. The channel region 74c2 is formed between the drain region 74d and the intermediate region 74m. The two channel regions 74c1 and 74c2, the source region 74s, the drain region 74d, and the intermediate region 74m are formed in the single continuous active layer 74. Further, an entire portion of the intermediate electrode 78m corresponding to a portion between the channel region 74c1 and the channel region 74c2 overlaps the gate electrode 72 with the intermediate region 74m and the gate insulating film 73 interposed therebetween.

It should be noted that the active layer 74 of the multichannel TFT 70 is formed by a microcrystalline silicon film or a laminated film including a microcrystalline silicon film and an amorphous silicon film, and can be manufactured using the fabrication process for the conventional a-Si TFTs. The microcrystalline silicon film can be formed using a silane gas diluted with a hydrogen gas as a material gas by a plasma CVD method that is similar to the manufacturing method of an amorphous silicon film.

Figure 27:
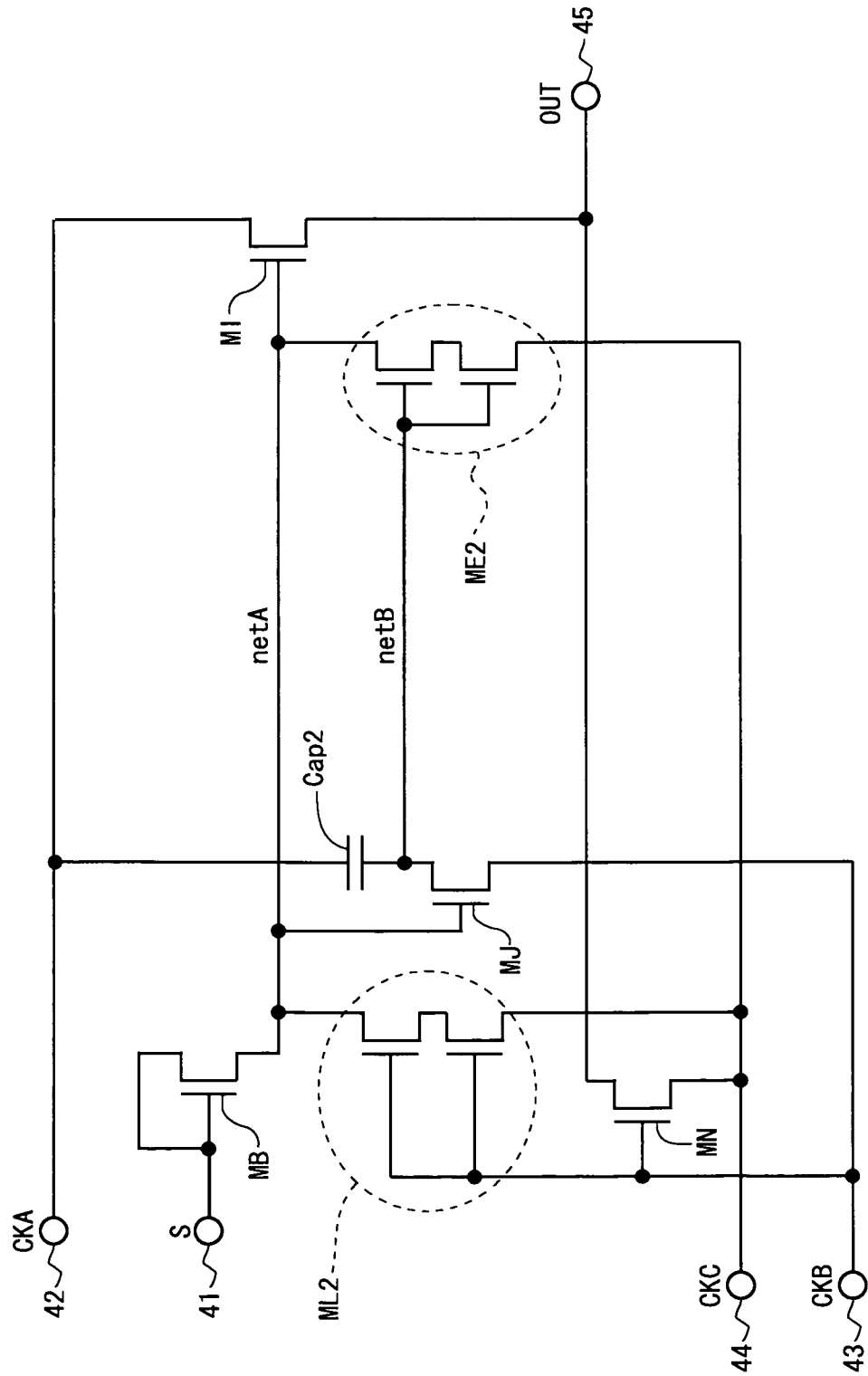
FIG. 27 is a circuit diagram illustrating the bistable circuit according to the first embodiment configured by the multichannel TFT.

As described above, configuring a thin film transistor whose drain electrode or source electrode is connected to the netA by the multichannel TFT (ML2, ME2) as, for example, shown in FIG. 27 can prevent the potential of the netA from decreasing due to a leak current in the thin film transistor caused by a high voltage between the source and the drain, even when the potential of the netA increases by bootstrapping.

<8. Others>

While the above embodiments are described taking the liquid crystal display device as an example, the present invention is not limited to this. The present invention can be applied to a display device of other types, such as an organic EL (Electro Luminescence) display.

Description of the Reference Numerals

40(1) to 40(i) . . . bistable circuits
41 to 44, and 46 . . . input terminals (of bistable circuit)
45 . . . output terminal (of bistable circuit)
200 . . . display control circuit
300 . . . source driver (video signal line drive circuit)
400 . . . gate driver (scanning signal line drive circuit)
410 . . . shift register
600 . . . display unit
Cap1 and Cap2 . . . capacitors
MB, ML, MN, MJ, MD1, MD2, MK1, MK2, MM, ME1, ME2, MI, and MX . . . thin film transistors
GL1 to GLi . . . gate bus lines
SL1 to SLj . . . source bus lines
GSP . . . gate start pulse signal
GCK . . . gate clock signal
CKA, CKB, and CKC . . . first clock, second clock, and third clock
S . . . start signal
R . . . reset signal
OUT . . . state signal

The invention claimed is:
1. A scanning signal line drive circuit of a display device that drives a plurality of scanning signal lines provided for a display unit, the scanning signal line drive circuit comprising:
 a shift register that includes a plurality of bistable circuits connected in series to each other, each having a first state and a second state, the bistable circuits being sequentially turned to the first state based on clock signals of three phases including a first clock signal, a second clock signal, and a third clock signal that are externally inputted and whose potentials are cyclically turned between a high level and a low level, wherein
 each bistable circuit includes:
  an output-node charge unit having a first switching element whose third electrode is connected to an output-node for outputting a state signal which should indicate one of the first state and the second state and whose second electrode is supplied with the first clock signal, and configured to turn a state indicated by the state signal to the first state;
  a first output-node discharge unit configured to receive at least one of the second clock signal and the third clock signal, and turn the state indicated by the state signal to the second state;
  a first-node charge unit configured to charge a first-node connected to a first electrode of the first switching element based on one of a predetermined input signal and a state signal outputted from a bistable circuit of a previous stage of a current bistable circuit;
  a first first-node discharge unit configured to receive at least one of the second clock signal and the third clock signal, and discharge the first-node;
  a second first-node discharge unit configured to discharge the first-node, the second first-node discharge unit having a second switching element whose third electrode is connected to the first-node;
  a second-node charge unit configured to charge a second-node connected to a first electrode of the second switching element based on the first clock signal;
  a first second-node discharge unit configured to discharge the second-node, the first second-node discharge unit having a third switching element whose first electrode is connected to the first-node and whose third electrode is connected to the second-node; and a second output-node discharge unit configured to discharge the output-node, the second output-node discharge unit having a seventh switching element whose first electrode is connected to the second-node, and whose third electrode is connected to the output-node, a duty ratio indicating a ratio of a period, in which a high level potential is maintained, to a cycle, in which the clock signals of the three phases repeat a high level potential and a low level potential, is one third, and the phases of the first clock signal, the second clock signal, and the third clock signal are different from each other by one third of one cycle, and in each bistable circuit, the first output-node discharge unit includes a fourth switching element whose third electrode is connected to the output-node, and whose first electrode is supplied with one of the second clock signal, the third clock signal, and a state signal outputted from a bistable circuit of a subsequent stage of the current bistable circuit, the first-node charge unit includes a fifth switching element whose second electrode is connected to the first-node, and whose first electrode and third electrode are supplied with one of the predetermined input signal and the state signal outputted from the bistable circuit of the previous stage of the current bistable circuit, the first first-node discharge unit includes a sixth switching element whose third electrode is connected to the first-node, and whose first electrode is supplied with one of the second clock signal, the third clock signal, and the state signal outputted from the bistable circuit of the subsequent stage of the current bistable circuit, and the first electrode of the fourth switching element and the first electrode of the sixth switching element are supplied with the state signal outputted from the bistable circuit of the subsequent stage of the current bistable circuit.

2. The scanning signal line drive circuit according to claim 1, wherein second electrodes of the second switching element, the third switching element, the fourth switching element, the sixth switching element, and the seventh switching element are supplied with one of the second clock signal, the third clock signal, and a direct-current potential that is equal to a potential of the clock signals of the three phases at the low level.

3. The scanning signal line drive circuit according to claim 1, wherein each bistable circuit further includes a second second-node discharge unit configured to discharge the second-node, the second second-node discharge unit having a ninth switching element whose first electrode is supplied with one of the second clock signal and the third clock signal, whose second electrode is supplied with one of the second clock signal, the third clock signal, and a direct-current potential that is equal to a potential of the clock signals of the three phases at the low level, and whose third electrode is connected to the second-node.

4. The scanning signal line drive circuit according to claim 1, wherein each bistable circuit further includes:

a fourth output-node discharge unit configured to discharge the output-node, the fourth output-node discharge unit having a tenth switching element whose first electrode is supplied with one of the second clock signal and the third clock signal, whose second electrode is supplied with one of the second clock signal, the third clock signal, and a direct-current potential that is equal to a potential of the clock signals of the three phases at the low level, and whose third electrode is connected to the output-node;

a third first-node discharge unit configured to discharge the first-node, the third first-node discharge unit having an eleventh switching element whose first electrode is supplied with one of the second clock signal and the third clock signal, whose second electrode is supplied with one of the second clock signal, the third clock signal, and the direct-current potential that is equal to the potential of the clock signals of the three phases at the low level, and whose third electrode is connected to the first-node; and a third second-node discharge unit configured to discharge the output-node, the third second-node discharge unit having a twelfth switching element whose first electrode is supplied with one of the second clock signal and the third clock signal, whose second electrode is supplied with one of the second clock signal, the third clock signal, and the direct-current potential that is equal to the potential of the clock signals of the three phases at the low level, and whose third electrode is connected to the second-node.

5. The scanning signal line drive circuit according to claim 1, wherein each bistable circuit further includes a second second-node discharge unit configured to discharge the second-node, the second second-node discharge unit having a ninth switching element whose first electrode is supplied with one of the second clock signal and the third clock signal, and whose third electrode is connected to the second-node.

6. The scanning signal line drive circuit according to claim 1, wherein each bistable circuit further includes a capacitor whose one end is connected to the first-node, and the other end is connected to the output-node.

7. The scanning signal line drive circuit according to claim 1, wherein the second-node charge unit includes a capacitor whose one end is connected to the second-node, and the other end is supplied with the first clock signal.

8. The scanning signal line drive circuit according to claim 1, wherein the second-node charge unit includes a thirteenth switching element whose third electrode is connected to the second-node, and whose first electrode and second electrode are supplied with the first clock signal.

9. The scanning signal line drive circuit according to claim 1, wherein the switching elements included in each bistable circuit are thin film transistors made of microcrystalline silicon.

10. The scanning signal line drive circuit according to claim 1, wherein the switching elements included in each bistable circuit are thin film transistors made of amorphous silicon.

11. The scanning signal line drive circuit according to claim 1, wherein at least one of the switching elements whose third electrode is connected to the first-node is a thin film transistor having a multichannel structure.

12. A scanning signal line drive circuit of a display device that drives a plurality of scanning signal lines provided for a display unit, the scanning signal line drive circuit comprising:

a shift register that includes a plurality of bistable circuits connected in series to each other, each having a first state and a second state, the bistable circuits being sequentially turned to the first state based on clock signals of three phases including a first clock signal, a second clock signal, and a third clock signal that are externally inputted and whose potentials are cyclically turned between a high level and a low level, wherein each bistable circuit includes:
- an output-node charge unit having a first switching element whose third electrode is connected to an output-node for outputting a state signal which should indicate one of the first state and the second state and whose second electrode is supplied with the first clock signal, and configured to turn a state indicated by the state signal to the first state;
- a first output-node discharge unit configured to receive at least one of the second clock signal and the third clock signal, and turn the state indicated by the state signal to the second state;
- a first-node charge unit configured to charge a first-node connected to a first electrode of the first switching element based on one of a predetermined input signal and a state signal outputted from a bistable circuit of a previous stage of a current bistable circuit;
- a first first-node discharge unit configured to receive at least one of the second clock signal and the third clock signal, and discharge the first-node;
- a second first-node discharge unit configured to discharge the first-node, the second first-node discharge unit having a second switching element whose third electrode is connected to the first-node;
- a second-node charge unit configured to charge a second-node connected to a first electrode of the second switching element based on the first clock signal;
- a first second-node discharge unit configured to discharge the second-node, the first second-node discharge unit having a third switching element whose first electrode is connected to the first-node and whose third electrode is connected to the second-node; and
- a third output-node discharge unit configured to discharge the output-node, the third output-node discharge unit having an eighth switching element whose first electrode is supplied with one of the second clock signal and the third clock signal, and whose third electrode is connected to the output-node, a duty ratio indicating a ratio of a period, in which a high level potential is maintained, to a cycle, in which the clock signals of the three phases repeat a high level potential and a low level potential, is one third, and the phases of the first clock signal, the second clock signal, and the third clock signal are different from each other by one third of one cycle, and in each bistable circuit,
- the first output-node discharge unit includes a fourth switching element whose third electrode is connected to the output-node, and whose first electrode is supplied with one of the second clock signal, the third clock signal, and a state signal outputted from a bistable circuit of a subsequent stage of the current bistable circuit,
- the first-node charge unit includes a fifth switching element whose second electrode is connected to the first-node, and whose first electrode and third electrode are supplied with one of the predetermined input signal and the state signal outputted from the bistable circuit of the previous stage of the current bistable circuit,
- the first first-node discharge unit includes a sixth switching element whose third electrode is connected to the first-node, and whose first electrode is supplied with one of the second clock signal, the third clock signal, and the state signal outputted from the bistable circuit of the subsequent stage of the current bistable circuit, and
- the first electrode of the fourth switching element and the first electrode of the sixth switching element are supplied with the state signal outputted from the bistable circuit of the subsequent stage of the current bistable circuit.

13. The scanning signal line drive circuit according to claim 12, wherein
second electrodes of the second switching element, the third switching element, the fourth switching element, the sixth switching element, and the eighth switching element are supplied with one of the second clock signal, the third clock signal, and a direct-current potential that is equal to a potential of the clock signals of the three phases at the low level.

14. The scanning signal line drive circuit according to claim 5, wherein
second electrodes of the second switching element, the third switching element, the fourth switching element, the sixth switching element, and the ninth switching element are supplied with one of the second clock signal, the third clock signal, and a direct-current potential that is equal to a potential of the clock signals of the three phases at the low level.

* * * * *